(12) United States Patent
Taguchi

(10) Patent No.: US 6,329,871 B2
(45) Date of Patent: Dec. 11, 2001

(54) REFERENCE VOLTAGE GENERATION CIRCUIT USING SOURCE FOLLOWERS

(75) Inventor: Masao Taguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/741,796

(22) Filed: Dec. 22, 2000

Related U.S. Application Data

(62) Division of application No. 09/154,167, filed on Sep. 16, 1998, now Pat. No. 6,225,855, which is a division of application No. 08/794,773, filed on Feb. 3, 1997, now Pat. No. 5,838,188, which is a continuation of application No. 08/462,594, filed on Jun. 5, 1995, now abandoned, which is a division of application No. 08/278,236, filed on Jul. 21, 1994, now abandoned.

(30) Foreign Application Priority Data

Aug. 31, 1993 (JP) .................................................. 5-215535

(51) Int. Cl.[7] ...................................................... G05F 1/10
(52) U.S. Cl. ........................... 327/539; 327/513; 323/315
(58) Field of Search .................................... 323/313, 315; 327/512, 513, 530, 538, 539, 540

(56) References Cited

U.S. PATENT DOCUMENTS

| | | |
|---|---|---|
| 4,204,133 | 5/1980 | Ahmed . |
| 4,409,677 | 10/1983 | Takemae et al. . |
| 4,490,670 | 12/1984 | Wong . |
| 4,616,172 | 10/1986 | Rahim . |
| 4,645,998 | 2/1987 | Shinohara et al. . |
| 4,868,483 | 9/1989 | Tsujimoto . |
| 5,218,238 | 6/1993 | Nonaka et al. . |
| 5,434,533 | 7/1995 | Furutani ............................... 327/538 |
| 5,483,150 | 1/1996 | Elliot et al. ........................... 323/312 |
| 5,798,637 * | 8/1998 | Kim et al. .............................. 323/313 |
| 5,818,292 | 10/1998 | Slemmer ............................... 327/539 |
| 5,959,446 | 9/1999 | Kuckreja ............................... 323/315 |
| 5,982,227 * | 11/1999 | Kim et al. .............................. 327/543 |
| 6,002,276 * | 12/1999 | Wu ........................................ 327/66 |
| 6,107,868 * | 8/2000 | Diniz et al. ........................... 327/543 |

FOREIGN PATENT DOCUMENTS

| | | |
|---|---|---|
| 43 31 895 | 3/1994 | (DE) . |
| 0 594 162 | 4/1994 | (EP) . |

OTHER PUBLICATIONS

P. Horowitz, et al., *The Art of Electronics*, p. 228, Figure 6.11, Cambridge University Press, 1980.
Research Disclosure, *Variable Response, On Chip, Low Voltage Supply*, (Feb. 1990), No. 310.
IBM Technical Disclosure Bulletin, vol. 32, No. 10A, Mar. 1990, pp. 26–28.
Japanese Abstracts, 06–104672(A), Apr. 1994, Takeshi Kajimoto (Mitsubishi Electric Corp.) (corresponding to German document 43 31 895, cited above).

* cited by examiner

*Primary Examiner*—Jung Ho Kim
(74) *Attorney, Agent, or Firm*—Armstrong, Westerman, Hattori, McLeland & Naughton, LLP

(57) ABSTRACT

A reference voltage generation circuit includes: a load unit having one end thereof connected to a higher voltage power supply line; an enhancement type n-channel MIS transistor having a drain thereof connected to the other end of the load unit, and a source thereof connected to a lower voltage power supply line; and a source follower circuit using a MIS transistor as a driving element, the source follower circuit having an input end thereof connected to the drain of the n-channel MIS transistor and having an output end thereof connected to a gate of the n-channel MIS transistor. A reference voltage is obtained at the drain of the n-channel MIS transistor. By the constitution, it is possible to obtain a stable reference voltage, and to incorporate the reference voltage generation circuit into an integrated circuit produced by integrating MIS transistors, without introducing an increase in production processes. It is also possible to reduce a consumed current of the reference voltage generation circuit.

13 Claims, 16 Drawing Sheets

REFERENCE VOLTAGE GENERATION CIRCUIT USING SOURCE FOLLOWERS

This application is a divisional of prior application Ser. No. 09/154,167, U.S. Pat. No. 6,225,855 filed Sep. 16, 1998, which is a division of prior application Ser. No. 08/794,773 filed Feb. 3, 1997, U.S. Pat. No. 5,838,188 which is a continuation of Ser. No. 08/462,594, filed Jun. 5, 1995, abandoned which is a division of prior application Ser. No. 08/278,236, filed Jul. 21, 1994 Abandoned.

BACKGROUND OF THE INVENTION

1. Field of the Invention

The present invention relates to a reference voltage generation circuit, more particularly, to a reference voltage generation circuit which can be suitably built in an integrated circuit formed by integrating metal insulation semiconductor (MIS) transistors, specifically metal oxide semiconductor (MOS) transistors, such as insulated-gate field-effect transistors.

2. Description of the Related Art

For example, a dynamic random access memory (DRAM) includes a voltage reduction circuit which reduces a reference voltage such as 5 [V] supplied from outside to 3 [V], and uses the reduced voltage as an internal power supply voltage. A reference voltage generation circuit is necessary for forming such a voltage reduction circuit.

Also, a reference voltage generation circuit is necessary when an analog integrated circuit, such as a D/A converter for converting a digital signal to an analog signal, or an A/D converter for converting an analog signal to a digital signal, is constructed.

Generally, it is preferable that a reference voltage is a constant voltage which does not depend on the temperature. In a MOS integrated circuit, however, an operation speed is proportional to a power supply voltage and is inversely proportional to the temperature. Accordingly, it is preferable that a reference voltage has positive temperature characteristics especially when the reference voltage is used in a voltage reduction circuit for generating an internal power supply voltage.

On the other hand, in an integrated circuit, an increase in production processes thereof leads to a resulting increase in cost and thus a reference voltage generation circuit to be built in the integrated circuit must have a formation which does not increase the production processes.

However, a known reference voltage generation circuit needs to be produced using a so-called "triple-well process", while a typical MOS integrated circuit can be produced using a so-called "twin-well process". Namely, when such a reference voltage generation circuit is incorporated into a typical MOS integrated circuit, a problem occurs in that the entire production process is increased due to the difference of the number of wells, i.e., the difference of the number of processes, and thus the cost of production is similarly increased.

Also, another reference voltage generation circuit is known in which it is difficult to restrict a consumed current therein to a predetermined amount or less. In this case, it would be possible to reduce the consumed current by setting a resistance value of a circuit element which determines the consumed current, to a greater value.

However, such an approach to reduce the consumed current is not practical since a considerably large area in the MOS integrated circuit is necessary in order to form such a resistance element.

Furthermore, when an external power supply voltage fed to a reference voltage generation circuit fluctuates in level, a problem occurs in that the generated reference voltage extremely becomes unstable depending on the temperature characteristics thereof.

Note, the problems in the prior art will be explained later in detail in contrast with the preferred embodiments of the present invention.

SUMMARY OF THE INVENTION

An object of the present invention is to provide a reference voltage generation circuit which can obtain a stable reference voltage.

Another object of the present invention is to provide a reference voltage generation circuit which can be built in an integrated circuit produced by integrating MIS transistors such as insulated-gate field-effect transistors, without introducing an increase in production processes.

Still another object of the present invention is to provide a reference voltage generation circuit which can reduce a consumed current thereof.

According to a first aspect of the present invention, there is provided a reference voltage generation circuit comprising: load means having one end thereof connected to a higher voltage power supply line; an enhancement type n-channel MIS transistor having a drain thereof connected to the other end of said load means, and a source thereof connected to a lower voltage power supply line; and a source follower circuit using a MIS transistor as a driving element, the source follower circuit having an input end thereof connected to the drain of said n-channel MIS transistor and having an output end thereof connected to a gate of said n-channel MIS transistor; wherein i reference voltage is obtained at the drain of said n-channel MIS transistor.

Also, according to a second aspect of the present invention, there is provided a reference voltage generation circuit comprising: load means having one end thereof connected to a higher voltage power supply line; an enhancement type n-channel MIS transistor having a drain thereof connected to the other end of said load means, and a source thereof connected to a lower voltage power supply line; and a plurality of source follower circuits using MIS transistors as driving elements, respectively, and connected in a cascade connection, an input end of a source follower circuit at the first stage in the cascade connection being connected to the drain of said n-channel MIS. transistor, an output end of a source follower circuit at the final stage in the cascade connection being connected to a gate of said n-channel MIS transistor; wherein a reference voltage is obtained at the drain of said n-channel MIS transistor.

BRIEF DESCRIPTION OF THE DRAWINGS

Other objects and features of the present invention will be described hereinafter in detail by way of preferred embodiments with reference to the accompanying drawings, in which.

DESCRIPTION OF THE PREFERRED EMBODIMENTS

For a better understanding of the preferred embodiments of the present invention, the related prior art will be explained with reference to FIGS. 1 to 4.

Figure 1:
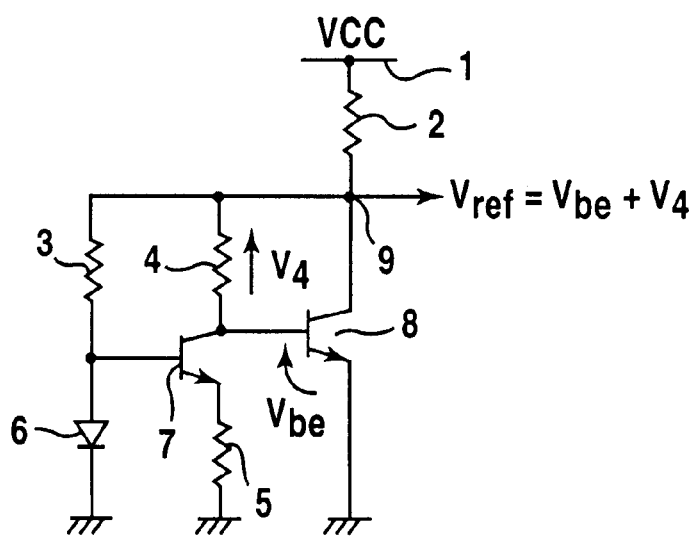
FIG. 1 is a circuit diagram showing the formation of a prior art reference voltage generation circuit.

FIG. 1 illustrates the circuit formation of a prior art reference voltage generation circuit.

The reference voltage generation circuit is referred to as a "band gap reference circuit". In the drawing, reference 1 denotes a power supply line for supplying a power supply voltage (non-stabilized voltage) VCC supplied from outside; references 2 to 5 each a resistor; reference 6 a diode; and references 7 and 8 each an NPN transistor.

This band gap reference circuit obtains a reference voltage Vref as the sum of a base-emitter voltage Vbe of the NPN transistor 8 and a voltage drop $V_1$ of the resistor 4, at node 9.

In the band gap reference circuit, the NPN transistors 7, 8 are essential. Therefore, when the band gap reference circuit is formed on a P type silicon substrate, a so-called "triple-well process" is necessary.

Figure 2:
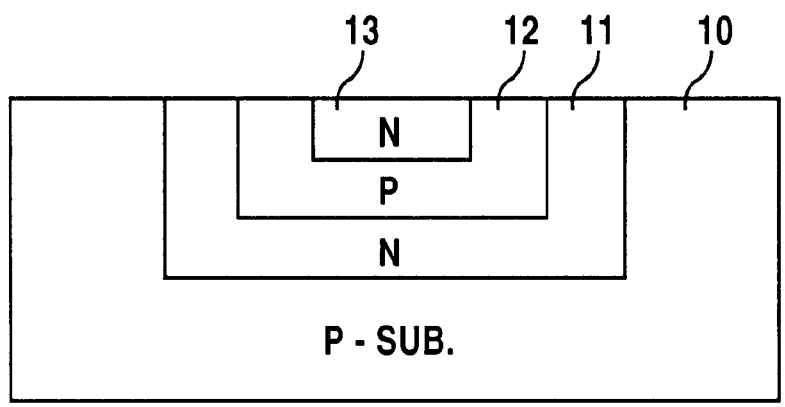
FIG. 2 is a sectional view for explaining a triple-well process.

In other words, as shown in FIG. 2, after an N type well 11 is formed on a P type silicon substrate 10, a P type well 12 is formed inside the N type well 11 and thereafter, an N type well 13 is formed inside the P type well 12.

In this case, an NPN triple diffusion type bipolar transistor can be formed on the P type silicon substrate 10, and thus the band gap reference circuit can be formed.

However, since a MOS integrated circuit can be produced using a twin-well process, the production process is increased when the band gap reference circuit which requires the triple-well process is to be incorporated in the MOS integrated circuit, and thus the cost of production is increased as much.

Also, in a DRAM used, for example, in a lap top type personal computer, it has been necessary to limit a consumed current in a stand-by state to 50 to 60 [$\mu$A] or less, so as to reduce a power consumption and to prevent a unnecessary consumption of a battery.

However, it is difficult for the band gap reference circuit to restrict the consumed current to 20 [$\mu$A] or less. Thus, it is not appropriate to incorporate the band gap reference circuit into a DRAM used in such a lap top type personal computer.

On the other hand, since a circuit element which determines the current in the band gap reference circuit is the resistor 2, the consumed current can be reduced by setting the value of the resistor 2 to a value above one million ohms.

However, a considerably large area is necessary in order to form a resistor greater than one millions ohms in an integrated circuit, and thus the formation of such a resistor is not possible in practice. The maximum resistance value that can be practically formed is 500 to 600 [k$\Omega$]. When such a resistor is used, it is not possible to reduce the consumed current to a value lower than the present value.

Figure 3:
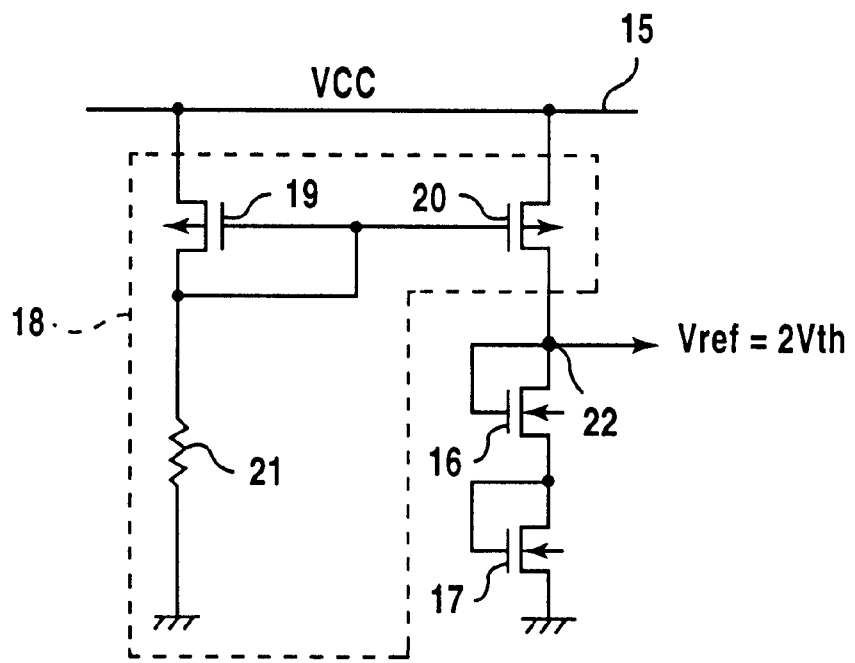
FIG. 3 is a circuit diagram showing the formation of another prior art reference voltage generation circuit.

FIG. 3 illustrates the circuit constitution of another prior art reference voltage generation circuit.

The illustrated reference voltage generation circuit utilizes a threshold voltage of an nMOS transistor. In the drawing, reference 15 denotes a power supply line for supplying a power supply voltage (non-stabilized voltage) VCC supplied from outside; references 16 and 17 each an enhancement type nMOs transistor; reference 18 a constant current supply circuit; references 19 and 20 each an enhancement type pMOS transistor and constituting a current mirror circuit; and reference 21 a resistor.

In the reference voltage generation circuit, gate-source voltages of the nMOS transistors 16, 17 are set to a threshold voltage Vth, respectively, and a voltage of 2Vth is obtained as a reference voltage Vref at node 22.

Since the reference voltage generation circuit comprises the nMOS transistors, the pMOS transistors and the resistor, it is possible to employ a twin-welt process even when the reference voltage generation circuit in built in a MOS integrated circuit, and thus to reduce a consumed current.

According to the circuit formation of FIG. 3, the gate-source voltages of the nMOS transistors 16, 17 are set to the threshold voltage Vth, respectively, in consideration of stability of the reference voltage Vref with respect to the power supply voltage VCC.

Figure 4:
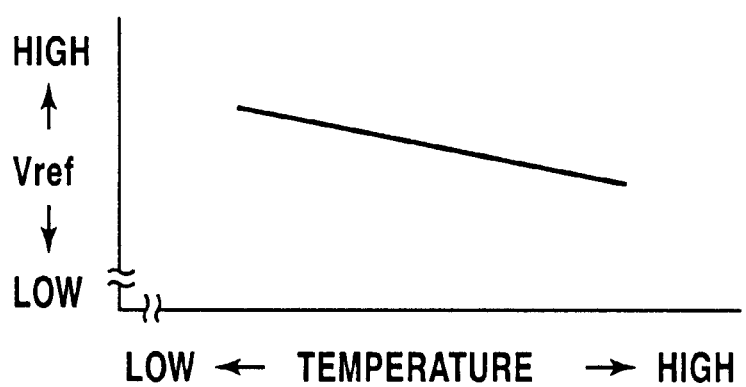
FIG. 4 is a graph showing temperature characteristics of a reference voltage generated by the prior art reference voltage generation circuit shown in FIG. 3.

In general, a threshold voltage of an nMOS transistor has negative temperature characteristics when a drain current is constant. For the reason, the reference voltage Vth generated by the reference voltage generation circuit unavoidably exhibits negative temperature characteristics as shown in FIG. 4.

As described before, it is preferable that the reference voltage Vref is a constant voltage which does not depend on the temperature. Especially when the reference voltage is used for a voltage reduction circuit for generating an internal power supply voltage, it is preferable that the reference voltage Vref has positive temperature characteristics, since the operation speed of an MOS integrated circuit is proportional to the power supply voltage and is inversely proportional to the temperature.

Here, the temperature characteristics of the reference voltage Vref generated by the reference voltage generation circuit can be rendered positive in a region where the gate-source voltage of each nMOS transistor 16, 17 exhibits the positive temperature characteristics under the condition that the drain current is constant, for example, when biasing is applied so that the gate-source voltage of each nMOS transistor 16, 17 attains 2 [V].

In this case, however, the nMOS transistors 16, 17 must have a large gate length (channel length) and a small gate width (channel width). In other words, each nMOS transistor 16, 17 must be formation in the form of a so-called "narrow transistor".

When such a transistor structure is used, each nMOS transistor 16, 17 exhibits the operation in a so-called "pentode region" with a high drain output impedance.

Accordingly, when the nMOS transistors 16, 17 are driven by the constant current supply circuit 18, it is brought to a state where two current sources are connected in series with each other, i.e., to a state where two circuits with a high internal resistance are connected in series. As a result, the reference voltage Vref as the output voltage extremely becomes unstable with respect to a change in the power supply voltage VCC.

Figure 5:
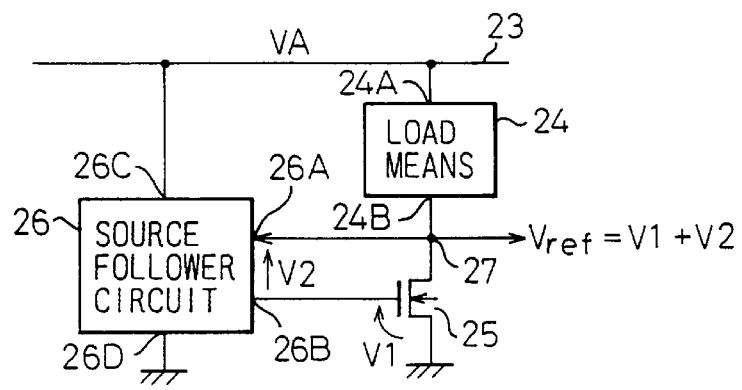
FIG. 5 is a diagram showing the fundamental arrangement of the reference voltage generation circuit according to a first aspect of the present invention.

FIG. 5 illustrates the fundamental formation of the reference voltage generation circuit according to a first aspect of the present invention.

In FIG. 5, reference 23 denotes a power supply line for supplying a power supply voltage (non-stabilized voltage) VA; reference 24 load means; reference 24A one end of the load means 24; and reference 24B the other end of the load means 24.

Also, reference 25 denotes an enhancement type n-channel insulated-gate field-effect transistor; reference 26 a source follower circuit using an insulated-gate field-effect transistor is a driving element; reference 26A an input end of the source follower circuit 26; reference 26B an output end of the source follower circuit 26; and references 26C and 26D a power supply terminal and a ground terminal, respectively, of the source follower circuit 26.

Reference Vref denotes a reference voltage which is obtained at the drain of the n-channel insulated-gate field-effect transistor 25, i.e., at node 27.

In the first aspect of the present invention, when the gate-source voltage of the n-channel insulated-gate field-effect transistor 25 is V1 and the voltage across the input end 26A and the output end 26B of the source follower circuit 26 is V2, the reference voltage Vref of V1+V2 can be obtained at node 27.

Where the reference voltage Vref rises due to any disturbance from outside, the output voltage of the source follower circuit 26 rises. Accordingly, the gate voltage of the n-channel insulated-gate field-effect transistor 25 rises, and thus the ON resistance of the n-channel insulated-gate field-effect transistor 25 becomes small. As a result, the reference voltage Vref falls to maintain voltage stability.

Inversely, when the reference voltage Vref falls, the output voltage of the source follower circuit 26 falls. Accordingly, the gate voltage of the n-channel insulated-gate field-effect transistor 25 falls, and thus the ON resistance of the n-channel insulated-gate field-effect transistor 25 becomes large. As a result, the reference voltage Vref rises to maintain voltage stability.

Thus, according to the first aspect of the present invention, the reference voltage Vref is subject to a feedback control through the source follower circuit 26. Accordingly, a stabilized reference voltage Vref having a constant voltage value can be obtained.

Also, the load means 24 can be constituted by a resistor or an insulated-gate field-effect transistor, and a load element of the source follower circuit 26 can also be formed by a resistor or an insulated-gate field-effect transistor. Therefore, the reference voltage generation circuit can be formed by only an insulated-gate field-effect transistor and a resistor.

As a result, it is possible to incorporate the reference voltage generation circuit into an integrated circuit which is produced by integrating insulated-gate field-effect transistors, without increasing the production process.

Also, it is possible to reduce the current flowing through the circuit, without providing any resistor of high resistance, and thus to reduce a consumed power.

Figure 6:
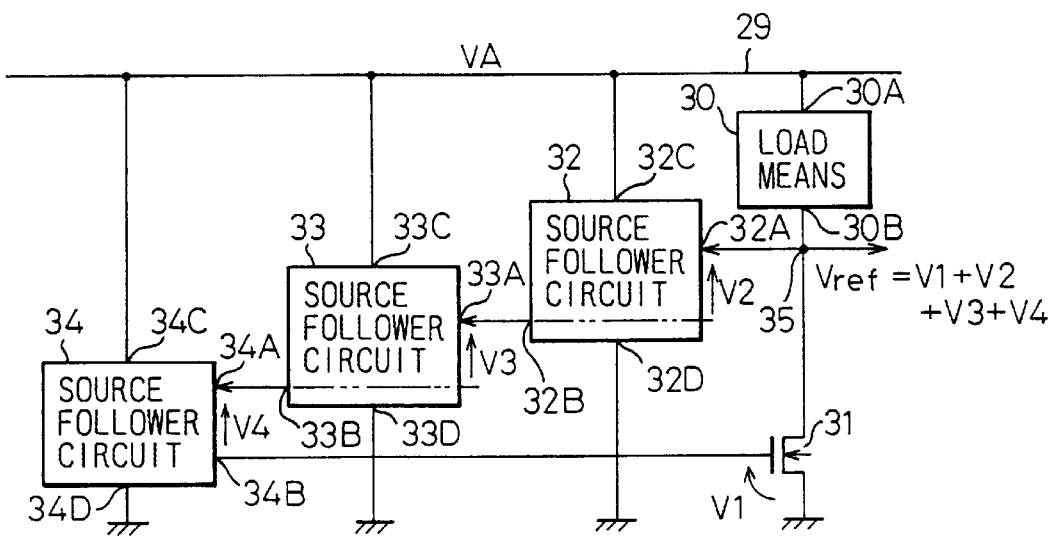
FIG. 6 is a diagram showing the fundamental arrangement of the reference voltage generation circuit according to a second aspect of the present invention.

FIG. 6 illustrates the fundamental formation of the reference voltage generation circuit according to a second aspect of the present invention.

In FIG. 6, reference 29 denotes a power supply line for supplying a power supply voltage (non-stabilized voltage) VA; reference 30 load means; reference 30A one end of the load means 30; and reference 30B the other end of the load means 30.

Also, reference 31 denotes an enhancement type n-channel insulated-gate field-effect transistor, and references 32 to 34 denote source follower circuits, respectively, using an insulated-gate field-effect transistor as a driving element. The source follower circuits 32, 33 and 34 are connected in a cascade connection with each other. Also, references 32A (33A, 34A), 32B (33B, 34B), 32C (33C, 34C) and 32D (33D, 34D) denote an input end, an output end, a power supply terminal, and a ground terminal of the source follower circuit 32 (33, 34), respectively.

Reference Vref denotes a reference voltage which is obtained at the drain of the n-channel insulated-gate field-effect transistor 31, i.e., at node 35.

In the second aspect of the present invention, when the gate-source voltage of the n-channel insulated-gate field-effect transistor 31 is V1; the voltage across the input end 32A and the output end 32B of the source follower circuit 32 is V2; the voltage across the input end 33A and the output end 33B of the source follower circuit 33 is V3; and the voltage across the input end 34A and the output end 34B of the source follower circuit 34 is V4, the reference voltage Vref of V1+V2+V3+V4 can be obtained at node 35.

Where the reference voltage Vref rises due to any disturbance from outside, the output voltages of the source follower circuits 32, 33 and 34 sequentially rises. Accordingly, the gate voltage of the n-channel insulated-gate field-effect transistor 31 rises, and thus the ON resistance of the n-channel insulated-gate field-effect transistor 31 becomes small. As a result, the reference voltage Vref falls to maintain voltage stability.

Inversely, when reference voltage Vref falls, the output voltages of the source follower circuits 32, 33 and 34 sequentially falls. Accordingly, the gate voltage of the n-channel insulated-gate field-effect transistor 31 falls, and thus the ON resistance of the n-channel insulated-gate field-effect transistor 31 becomes large. As a result, the reference voltage Vref rises to maintain voltage stability.

Thus, according to the second aspect of the present invention, the reference voltage Vref is subject to a feedback control through the source follower circuits 32 to 34. Accordingly, a stabilized reference voltage Vref having a constant voltage value can be obtained.

Also, the load means 30 can be constituted by a resistor or an insulated-gate field-effect transistor, and each load element of the source follower circuits 32 to 34 can also be constituted by a resistor or an insulated-gate field-effect transistor. Therefore, the reference voltage generation circuit can be formed by using only insulated-gate field-effect transistors and resistors.

As a result, it is possible to incorporate the reference voltage generation circuit into an integrated circuit which is produced by integrating insulated-gate field-effect transistors, without increasing the production process.

Also, it is possible to reduce the current flowing through the circuit, without providing any resistor of high resistance, and thus to reduce a consumed power.

Next, the preferred embodiments of the present invention will be explained in detail with reference to FIGS. 7 to 29.

Figure 7:
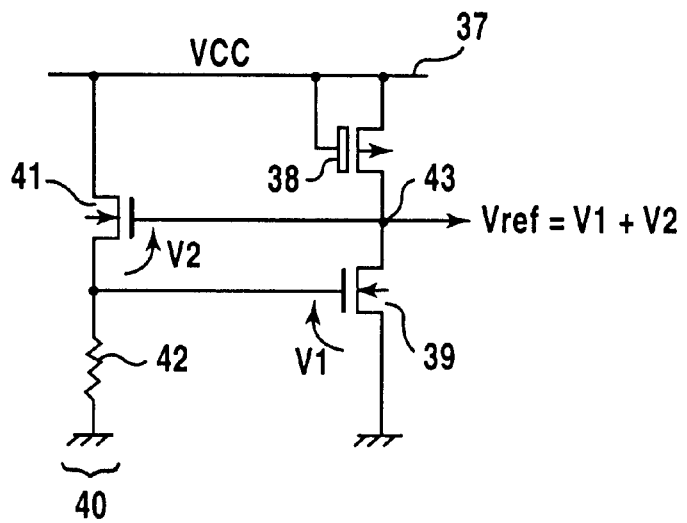
FIG. 7 is a circuit diagram showing a preferred exemplary embodiment of the present invention.

FIG. 7 illustrates the circuit formation of the preferred exemplary embodiment of the present invention. In the drawing, reference 37 denotes a power supply line for supplying a power supply voltage (non-stabilized voltage) VCC supplied from outside; and reference 38 denotes a depletion type pMOS transistor which serves as a load means.

Also, reference 39 denotes an enhancement type nMOS transistor; reference 40 a source follower circuit; reference 41 an enhancement type nMOS transistor which constitutes a driving element; and reference 42 a resistor which serves as a load element.

A source and a gate of the pMOS transistor 38 are connected to the VCC power supply line 37, and a drain thereof is connected to a drain of the nMOS transistor 39. A source of the nMOS transistor 39 is grounded.

A drain of the nMOS transistor 41 is connected to the VCC power supply line 37; a gate thereof is connected to node 43; and a source thereof is connected to a gate of the nMOS transistor 39. One end of the resistor 42 is connected to the source of the nMOS transistor 41, and the other end thereof is grounded.

In the preferred exemplary embodiment, when the gate-source voltage of the nMOS transistor 39 is V1 and the gate-source voltage of the nMOS transistor 41 is V2, the reference voltage Vref of V1+V2 can be obtained at node 43.

When the reference voltage Vref rises due to any disturbance from outside, the source voltage of the nMOS transistor 41 rises. Accordingly, the gate voltage of the nMOS transistor 39 rises, and thus the ON resistance of the nMOS transistor 39 becomes small. As a result, the reference voltage Vref falls to maintain voltage stability.

Inversely, when the reference voltage Vref falls, the source voltage of the nMOS transistor 41 falls. Accordingly, the gate voltage of the nMOS transistor 39 falls, and thus the ON resistance of the nMOS transistor 39 becomes large. As a result, the reference voltage Vref rises to maintain voltage stability.

As described above, according to the first embodiment, the reference voltage Vref is subject to a feedback control through the source follower circuit 40. Accordingly, a stabilized reference voltage Vref having a constant voltage value can be obtained.

Figure 8:
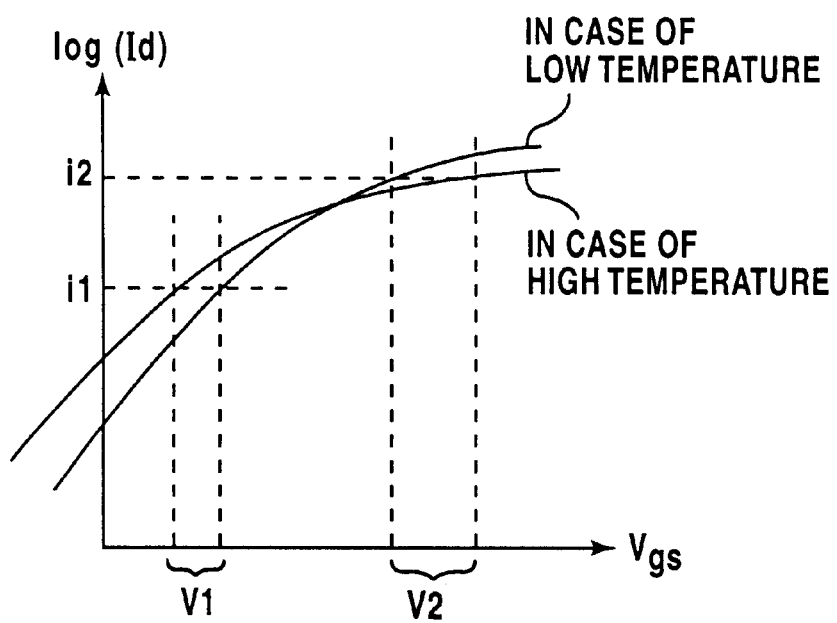
FIG. 8 is a graph showing VG-log(Id) characteristics of an enhancement type nMOS transistor.

In the preferred exemplary embodiment, the temperature coefficient of the reference voltage Vref can be set to "0" by setting V1 and V2 in a region where their temperature characteristics become inverse to each other, for example, as shown in FIG. 8, by setting V1 in a region where $|\partial Vgs/\partial T|_{Id=const}$ <0, i.e., in a region where the the gate voltage Vgs various inversely with the temperature when the drain current Id is constant, and by setting V2 in a region where $|\partial Vgs/\partial T|_{Id=const}$ >0, i.e., in a region where the gate voltage Vgs varies with the temperature when the drain current Id is constant.

Also, the temperature coefficient of the reference voltage Vref can be set to "0" by setting V1 in a region where $|\partial Vgs/\partial T|_{Id=const}$ >0, i.e., in a region where the gate voltage Vgs varies with the temperature when the drain current Id is constant, and by setting V2 in a region where $|\partial Vgs/\partial T|_{Id=const}$ <0, i.e., in a region where the gate voltage V varies inversely the temperature when the drain current Id is constant.

In this case, the nMOS transistor 39 must be formed in such a manner that as the transistor alone, its output internal resistance becomes high. However, since the nMOS transistor 39 is subject to a feedback control through the source follower circuit 40, the output internal resistance can be lowered, and thus a stability of the reference voltage Vref can be maintained.

On the other hand, the temperature coefficient of the reference voltage Vref can be made positive by setting both of V1 and V2 in a region where $|\partial Vgs/\partial T|_{Id=const}$ >0, i.e., in a region where the gate voltage Vgs varies proportionately with the temperature when the drain current Id is constant.

In this case as well, the nMOS transistor 39 must be constituted in such a manner that as the transistor alone, its output internal resistance becomes high. However, since the nMOS transistor 39 is subject to a feedback control through the source follower circuit 40, the output internal resistance can be lowered, and thus a stability of the reference voltage Vref can be maintained.

According to the preferred exemplary embodiment, since the circuit is constituted by the pMOS transistor 38, the nMOS transistors 39, 41 and the resistor 42, it is possible to incorporate the present circuit into a MOS integrated circuit without increasing the production process.

Also, it is only necessary for the source follower circuit 40 to generate the gate-source voltage V1 of the nMOS transistor 39. Accordingly, it is possible to reduce the current without providing a high resistance in resistor 42, and to reduce the consumed current.

Figure 9:
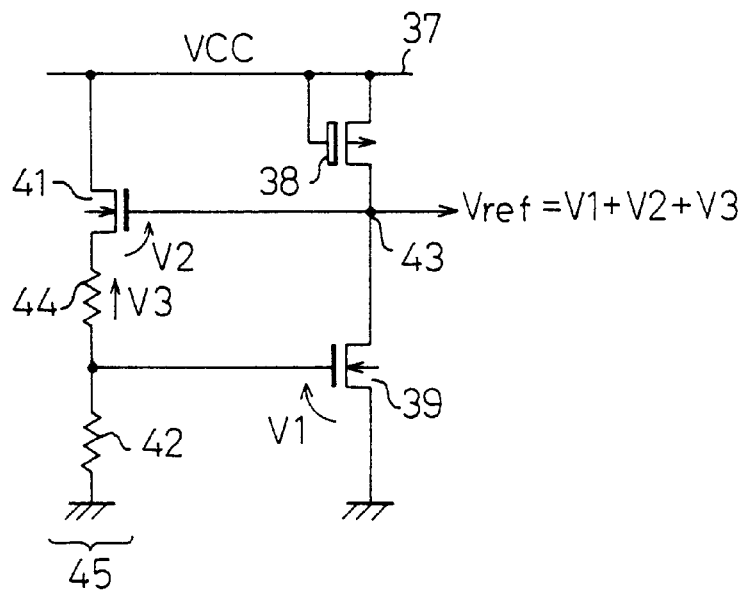
FIG. 9 is a circuit diagram showing a second embodiment of the present invention.

FIG. 9 illustrates the circuit formation of the second embodiment of the present invention. This second embodiment has the same formation as the first embodiment except that a source follower circuit 45 is provided by connecting the source of the nMOS transistor 41 via a resistor 44 to one end of the resistor 42 and to the gate of the nMOS transistor 39.

In the second embodiment, when the gate-source voltage of the nMOS transistor 39 is V1; the gate-source voltage of the nMOS transistor 41 is V2; and the voltage drop in the resistor 44 is V3, the reference voltage Vref of V1+V2+V3 can be obtained at node 43.

When the reference voltage Vref rises due to any disturbance from outside, the source voltage of the nMOS transistor 41 rises, and thus the voltage at the other end of the resistor 44 rises. Accordingly, the gate voltage of the nMOS transistor 39 rises, and thus the ON resistance of the nMOS transistor 39 becomes small. As a result, the reference voltage Vref falls to maintain voltage stability.

Inversely, when the reference voltage Vref falls, the source voltage of the nMOS transistor 41 fall, and thus the voltage at the other end of the resistor 44 falls. Accordingly, the gate voltage of the nMOS transistor 39 falls, and thus the ON resistance of the nMOS transistor 39 becomes large. As a result, the reference voltage Vref rises to maintain voltage stability.

As described above, according to the second embodiment, the reference voltage Vref is subject to a feedback control through the source follower circuit 45. Accordingly, a stabilized reference voltage Vref having a constant voltage value can be obtained.

Also, since the circuit is formed by the pMOS transistor 38, the nMOS transistors 39, 41 and the resistors 42, 44, it is possible to incorporate the present circuit into a MOS integrated circuit without increasing the production process.

Furthermore, it is only necessary for the source follower circuit 45 to generate the gate-source voltage V1 of the nMOS transistor 39. Accordingly, it is possible to reduce the current without providing a high resistance in resistor 42, and thus to reduce the consumed current.

Figure 10:
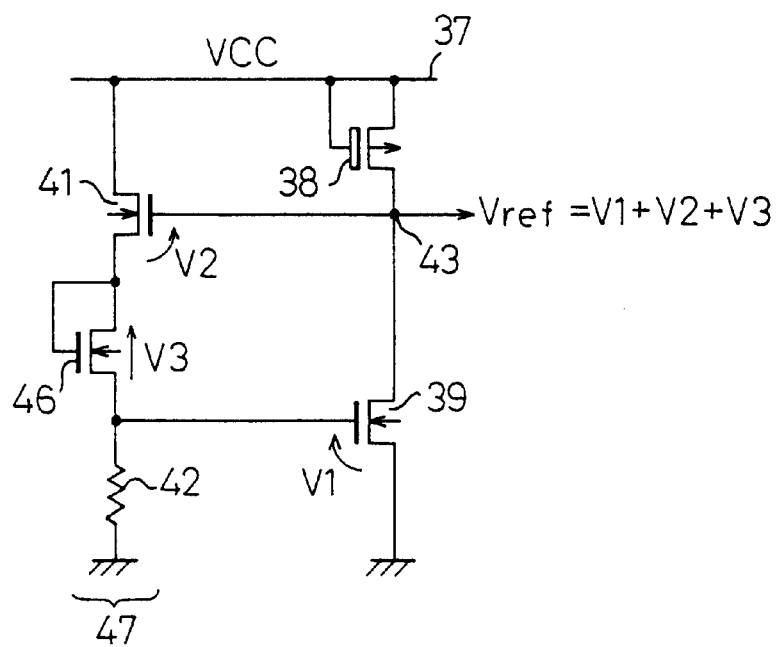
FIG. 10 is a circuit diagram showing a third embodiment of the present invention.

FIG. 10 illustrates the circuit formation of the third embodiment of the present invention. This third embodiment has the same formation as the first embodiment except that a source follower circuit 47 is provided by connecting the source of the nMOS transistor 41 via an nMOS transistor 46 with a diode-connected form to one end of the resistor 42 and to the gate of the nMOS transistor 39.

In the third embodiment, when the gate-source voltage of the nMOS transistor 39 is V1; the gate-source voltage of the nMOS transistor 41 is V2; and the drain-source voltage of the nMOS transistor 46 is V3, the reference voltage Vref of V1+V2+V3 can be obtained at node 43.

When the reference voltage Vref rises due to any disturbance from outside, the source voltage of the nMOS transistor 41 rises, and thus the source voltage of the nMOS transistor 46 rises. Accordingly, the gate voltage of the nMOS transistor 39 rises, and thus the ON resistance of the nMOS transistor 39 becomes small. As a result, the reference voltage Vref falls to maintain voltage stability.

Inversely, when the reference voltage Vref falls, the source voltage of the nMOS transistor 41 falls, and thus the source voltage of the nMOS transistor 46 falls. Accordingly, the gate voltage of the nMOS transistor 39 falls, and thus the ON resistance of the nMOS transistor 39 becomes large. As a result, the reference voltage Vref rises to maintain voltage stability.

As described above, according to the third embodiment, the reference voltage Vref is subject to a feedback control through the source follower circuit 47. Accordingly, a stabilized reference voltage Vref having a constant voltage value can be obtained.

Also, since the circuit is formed by the pMOS transistor 38, the nMOS transistors 39, 41, 46 and the resistor 42, it is possible to incorporate the present circuit into a MOS integrated circuit without increasing the production process.

Furthermore, it is only necessary for the source follower circuit 47 to generate the gate-source voltage V1 of the nMOS transistor 39. Accordingly, it is possible to reduce the current without providing a high resistance in resistor 42, and thus to reduce the consumed current.

Figure 11:
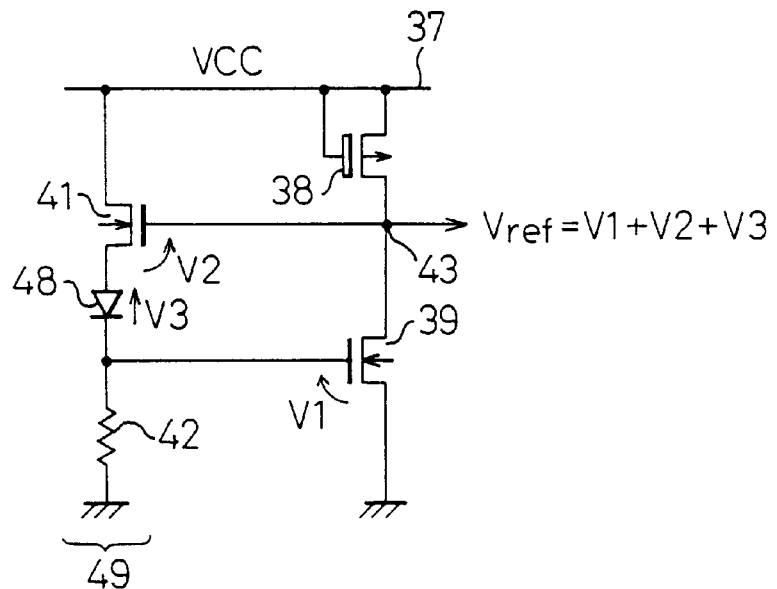
FIG. 11 is a circuit diagram showing a fourth embodiment of the present invention.

FIG. 11 illustrates the circuit formation of the fourth embodiment of the present invention. This fourth embodiment has the same formation as the first embodiment except that a source follower circuit 49 is provided by connecting the source of the nMOS transistor 41 via a diode 48 to one end of the resistor 42 and to the gate of the nMOS transistor 39.

In the fourth embodiment, when the gate-source voltage of the nMOS transistor 39 is V1; the gate-source voltage of the nMOS transistor 41 is V2; and the anode-cathode voltage of the diode 48 is V3, the reference voltage Vref of V1+V2+V3 can be obtained at node 43.

When the reference voltage Vref rises due to any disturbance from outside, the source voltage of the nMOS transistor 41 rises, and thus the cathode voltage of the diode 48 rises. Accordingly, the gate voltage of the nMOS transistor 39 rises, and thus the ON resistance of the nMOS transistor 39 becomes small. As a result, the reference voltage Vref falls to maintain voltage stability.

Inversely, when the reference voltage Vref falls, the source voltage of the nMOS transistor 41 falls, and thus the cathode voltage of the diode 48 falls. Accordingly, the gate voltage of the nMOS transistor 39 falls, and thus the ON resistance of the nMOS transistor 39 becomes large. As a result, the reference voltage Vref rises to maintain voltage stability.

As described above, according to the fourth embodiment, the reference voltage Vref is subject to a feedback control through the source follower circuit 49. Accordingly, a stabilized reference voltage Vref having a constant voltage value can be obtained.

Also, since the circuit is formed by the pMOS transistor 38, the nMOS transistors 39, 41, the diode 48 and the resistor 42, it is possible to incorporate the present circuit into a MOS integrated circuit without increasing the production process.

Furthermore, it is only necessary for the source follower circuit 49 to generate the gate-source voltage V1 of the nMOS transistor 39. Accordingly, it is possible to reduce the current without providing a high resistance in resistor 42, and thus to reduce the consumed current.

Figure 12:
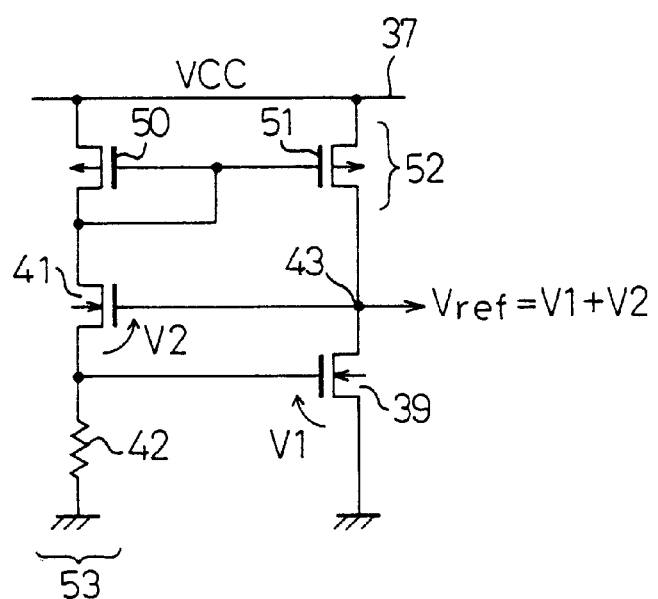
FIG. 12 is a circuit diagram showing a fifth embodiment of the present invention.

FIG. 12 illustrates the circuit formation of the fifth embodiment of the present invention. The fifth embodiment has the same formation as the first embodiment except that a current mirror circuit 52 including enhancement type pMOS transistors 50 and 51 is provided as load means of the nMOS transistors 39 and 41.

A source of the pMOS transistor 50 is connected to the VCC power supply line 37; a gate thereof is connected to a drain thereof; and the drain is connected to the drain of the nMOS transistor 41. The pMOS transistor 50, the nMOS transistor 41 and the resistor 42 form a source follower circuit 53.

Also, a source of the pMOS transistor 51 is connected to the VCC power supply line 37; a gate thereof is connected to the gate of the pMOS transistor 50; and a drain thereof is connected to the drain of the nMOS transistor 39.

According to the above construction, the same amount of current flows through the nMOS transistor 39 as that flowing through the nMOS transistor 41 by means of the operation of the current mirror circuit 52. As a result, even if the power supply voltage VCC is changed in level, the current flowing through the nMOS transistor 41 is not changed, and thus the waste of the consumed current can be eliminated.

In the fifth embodiment, when the gate-source voltage of the nMOS transistor 39 is V1 and the gate-source voltage of the nMOS transistor 41 is V2, the reference voltage Vref of V1+V2 can be obtained at node 43.

When the reference voltage Vref rises due to any disturbance from outside, the source voltage of the nMOS transistor 41 rises. Accordingly, the gate voltage of the nMOS transistor 39 rises, and thus the ON resistance of the nMOS transistor 39 becomes small. As a result, the reference voltage Vref falls to maintain voltage stability.

Inversely, when the reference voltage Vref falls, the source voltage of the nMOS transistor 41 falls. Accordingly, the gate voltage of the nMOS transistor 39 falls, and thus the ON resistance of the nMOS transistor 39 becomes large. As a result, the reference voltage Vref rises to maintain voltage stability.

As described above, according to the fifth embodiment, the reference voltage Vref is subject to a feedback control through the source follower circuit 53. Accordingly, a stabilized reference voltage Vref having a constant voltage value can be obtained.

In the fifth embodiment, the temperature coefficient of the reference voltage Vref can be set to "0" by setting V1 and V2 in a region where their temperature characteristics become inverse to each other, for example, as shown in FIG. 8, by setting V1 in a region where $|\partial VG/\partial T|_{Id=const} < 0$, i.e., in a region where the change of the gate voltage VG becomes negative with respect to the temperature when the drain current Id is constant, and by setting V2 in a region where $|\partial VG/\partial T|_{Id=const} > 0$, i.e., in a region where the change of the gate voltage VG becomes positive with respect to the temperature when the drain current Id is constant.

Also, the temperature coefficient of the reference voltage Vref can be set to "0" by setting V1 in a region where $|\partial VG/\partial T|_{Id=const} > 0$, i.e., in a region where the change of the gate voltage VG becomes positive with respect to the temperature when the drain current Id is constant, and by setting V2 in a reunion where $|\partial VG/\partial T|_{Id=const} < 0$, i.e., in a region where the change of the gate voltage VG becomes negative with respect to the temperature when the drain current Id is constant.

In this case, the nMOS transistor 39 must be constituted in such a manner that as the transistor alone, its output internal resistance becomes high. However, since the nMOS transistor 39 is subject to a feedback control through the source follower circuit 53, the output internal resistance can be lowered, and thus a stability of the reference voltage Vref can be maintained.

On the other hand, the temperature coefficient of the reference voltage Vref can be made positive by setting both of V1 and V2 in a region where $|\partial VG/\partial T|_{Id=const} > 0$, i.e., in a region where the change of the gate voltage VG becomes positive with respect to the temperature when the drain current Id is constant.

In this case as well, the nMOS transistor 39 must be formed in such a manner that as the transistor alone, its output internal resistance becomes high. However, since the nMOS transistor 39 is subject to a feedback control through the source follower circuit 53, the output internal resistance can be lowered, and thus a stability of the reference voltage Vref can be maintained.

According to the fifth embodiment, since the circuit is formed by the pMOS transistors 50, 51, the nMOS transistors 39, 41 and the resistor 42, it is possible to incorporate the present circuit into a MOS integrated circuit without increasing the production process.

Also, it is only necessary for the source follower circuit 53 to generate the gate-source voltage V1 of the nMOS transistor 39. Accordingly, it is possible to reduce the current without providing a high resistance in resistor 42, and to reduce the consumed current.

Figure 13:
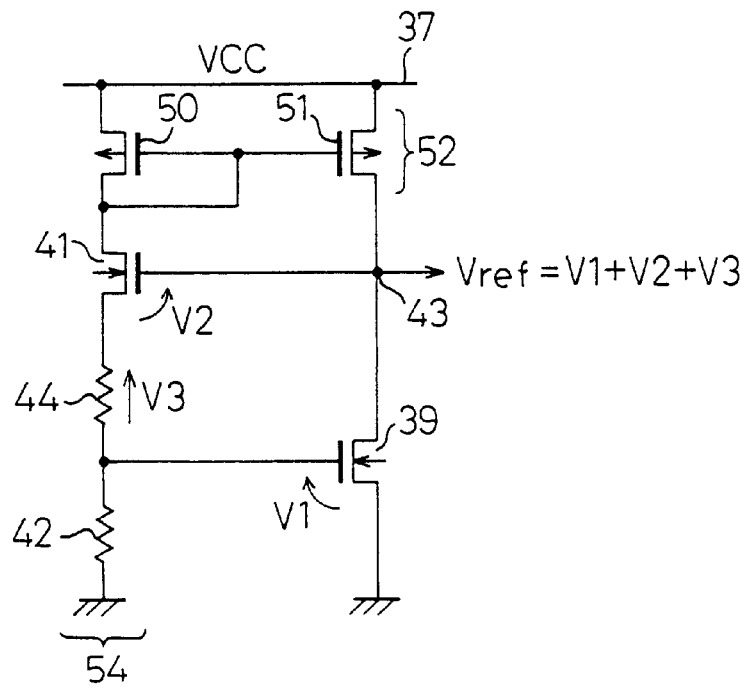
FIG. 13 is a circuit diagram showing a sixth embodiment of the present invention.

FIG. 13 illustrates the circuit formation of the sixth embodiment of the present invention. This sixth embodiment has the same formation as the fifth embodiment except that a source follower circuit 54 is provided by connecting the source of the nMOS transistor 41 via a resistor 44 to one end of the resistor 42 and to the gate of the nMOS transistor 39.

In the sixth embodiment, when the gate-source voltage of the nMOS transistor 39 is V1; the gate-source voltage of the nMOS transistor 41 is V2; and the voltage drop in the resistor 44 is V3, the reference voltage Vref of V1+V2+V3 can be obtained at node 43.

When the reference voltage Vref rises due to any disturbance from outside, the source voltage of the nMOS transistor 41 rises, and thus the voltage at the other end of the resistor 44 rises. Accordingly, the gate voltage of the nMOS transistor 39 rises, and thus the ON resistance of the nMOS transistor 39 becomes small. As a result, the reference voltage Vref falls to maintain voltage stability.

Inversely, when the reference voltage Vref falls, the source voltage of the nMOS transistor 41 falls, and thus the voltage at the other end of the resistor 44 falls. Accordingly, the gate voltage of the nMOS transistor 39 falls, and thus the ON resistance of the nMOS transistor 39 becomes large. As a result, the reference voltage Vref rises to maintain voltage stability.

As described above, according to the sixth embodiment, the reference voltage Vref is subject to a feedback control through the source follower circuit 54. Accordingly, a stabilized reference voltage Vref having a constant voltage value can be obtained.

Also, since the circuit is formed by the pMOS transistors 50, 51, the nMOS transistors 39, 41 and the resistors 42, 44, it is possible to incorporate the present circuit into a MOS integrated circuit without increasing the production process.

Furthermore, it is only necessary for the source follower circuit 54 to generate the gate-source voltage V1 of the nMOS transistor 39. Accordingly, it is possible to reduce the current without providing a high resistance as the resistor 42, and thus to reduce the consumed current.

Figure 14:
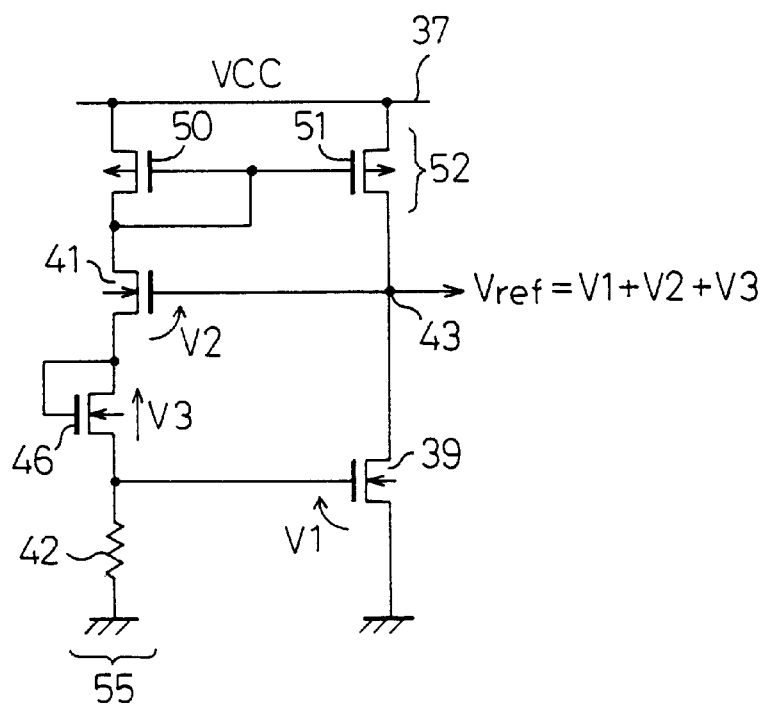
FIG. 14 is a circuit diagram showing a seventh embodiment of the present invention.

FIG. 14 illustrates the circuit formation of the seventh embodiment of the present invention. This seventh embodiment has the same formation as the fifth embodiment except that a source follower circuit 55 is provided by connecting the source of the nMOS transistor 41 via an nMOS transistor 46 with a diode-connected form to one end of the resistor 42 and to the gate of the nMOS transistor 39.

In the seventh embodiment, when the gate-source voltage of the nMOS transistor 39 is V1; the gate-source voltage of the nMOS transistor 41 is V2; and the drain-source voltage of the nMOS transistor 46 is V3, the reference voltage Vref of V1+V2+V3 can be obtained at node 43.

When the reference voltage Vref rises due to any disturbance from outside, the source voltage of the nMOS transistor 41 rises, and thus the source voltage of the nMOS transistor 46 rises. Accordingly, the gate voltage of the nMOS transistor 39 rises, and thus the ON resistance of the nMOS transistor 39 becomes small. As a result, the reference voltage Vref falls to maintain voltage stability.

Inversely, when the reference voltage Vref falls, the source voltage of the nMOS transistor 41 falls, and thus the source voltage of the nMOS transistor 46 falls. Accordingly, the gate voltage of the nMOS transistor 39 falls, and thus the ON resistance of the nMOS transistor 39 becomes large. As a result, the reference voltage Vref rises to maintain voltage stability.

As described above, according to the seventh embodiment, the reference voltage Vref is subject to a feedback control through the source follower circuit 55. Accordingly, a stabilized reference voltage Vref having a constant voltage value can be obtained.

Also, since the circuit is formed by the pMOS transistors 50, 51, the nMOS transistors 39, 41, 46 and the resistor 42, it is possible to incorporate the present circuit into a MOS integrated circuit without increasing the production process.

Furthermore, it is only necessary for the source follower circuit 55 to generate the gate-source voltage V1 of the nMOS transistor 39. Accordingly, it is possible to reduce the current without providing a high resistance as the resistor 42, and thus to reduce the consumed current.

Figure 15:
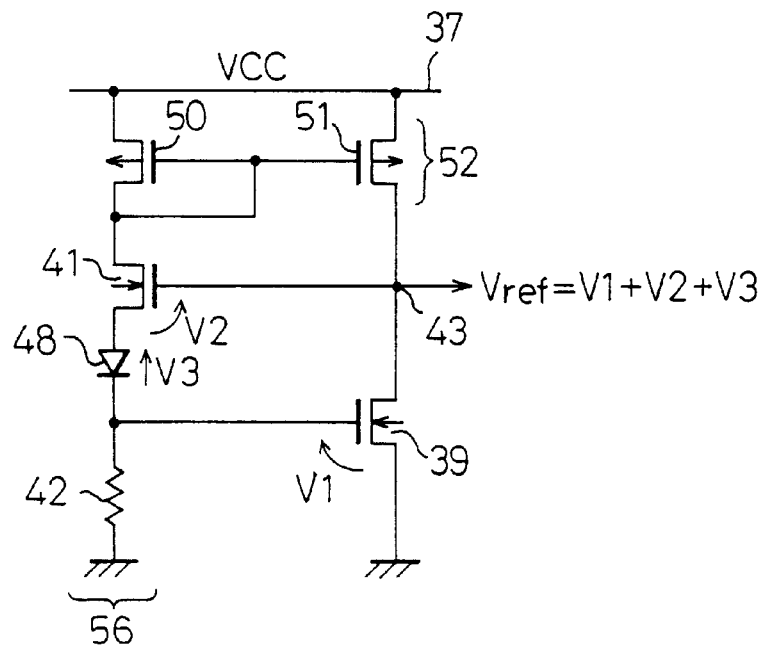
FIG. 15 is a circuit diagram showing an eighth embodiment of the present invention.

FIG. 15 illustrates the circuit formation of the eighth embodiment of the present invention. This eighth embodiment has the same formation as the fifth embodiment except that a source follower circuit 56 is provided by connecting the source of the nMOS transistor 41 via a diode 48 to one end of the resistor 42 and to the gate of the nMOS transistor 39.

In the eighth embodiment, when the gate-source voltage of the nMOS transistor 39 is V1; the gate-source voltage of the nMOS transistor 41 is V2; and the anode-cathode voltage of the diode 48 is V3, the reference voltage Vref of V1+V2+V3 can be obtained at node 43.

When the reference voltage Vref rises due to any disturbance from outside, the source voltage of the nMOS transistor 41 rises, and thus the cathode voltage of the diode 48 rises. Accordingly, the gate voltage of the nMOS transistor 39 rises, and thus the ON resistance of the nMOS transistor 39 becomes small. As a result, the reference voltage Vref falls to maintain voltage stability.

Inversely, when the reference voltage Vref falls, the source voltage of the nMOS transistor 41 falls, and thus the cathode voltage of the diode 48 falls. Accordingly, the gate voltage of the nMOS transistor 39 falls, and thus the ON resistance of the nMOS transistor 39 becomes large. As a result, the reference voltage Vref rises to maintain voltage stability.

As described above, according to the eighth embodiment, the reference voltage Vref is subject to a feedback control through the source follower circuit 56. Accordingly, a stabilized reference voltage Vref having a constant voltage value can be formed.

Also, since the circuit is formed by the pMOS transistors 50, 51, the nMOS transistors 39, 41, the diode 48 and the resistor 42, it is possible to incorporate the present circuit into a MOS integrated circuit without increasing the production process.

Furthermore, it is only necessary for the source follower circuit 56 to generate the gate-source voltage V1 of the nMOS transistor 39. Accordingly, it is possible to reduce the current without providing a high resistance as the resistor 42, and thus to reduce the consumed current.

Figure 16:
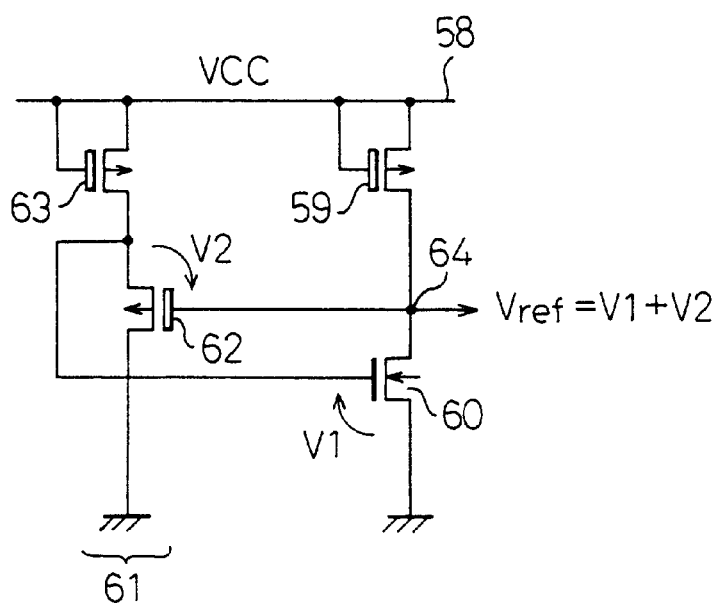
FIG. 16 is a circuit diagram showing a ninth embodiment of the present invention.

FIG. 16 illustrates the circuit formation of the ninth embodiment of the present invention. In the drawing, reference 58 denotes a power supply line for supplying a power supply voltage (non-stabilized voltage) VCC supplied from outside; and reference 59 denotes a depletion type pMOS transistor serving as load means.

Also, reference 60 denotes an enhancement type nMOS transistor; reference 61 a source follower circuit; reference 62 a depletion type pMOS transistor functioning as a driving element; and reference 63 a depletion type pMOS transistor functioning as a load element.

A source and a gate of the pMOS transistor 59 are connected to the VCC power supply line 58, and a drain thereof is connected to a drain of the nMOS transistor 60. A source of the nMOS transistor 60 is grounded. Also, a source and a gate of the pMOS transistor 63 are connected to the VCC power supply line 58, and a drain thereof is connected to a source of the pMOS transistor 62. A gate of the pMOS transistor 62 is connected to node 64; the source thereof is connected to a gate of the nMOS transistor 60; and a drain thereof is grounded.

In the ninth embodiment, when the gate-source voltage of the nMOS transistor 60 is V1 and the gate-source voltage of the pMOS transistor 62 is V2, the reference voltage Vref of V1+V2 can be obtained at node 64.

When the reference voltage Vref rises due to any disturbance from outside, the source voltage of the pMOS transistor 62 rises. Accordingly, the gate voltage of the nMOS transistor 60 rises, and thus the ON resistance of the nMOS transistor 60 becomes small. As a result, the reference voltage Vref falls to maintain voltage stability.

Inversely, when the reference voltage Vref falls, the source voltage of the pMOS transistor 62 falls. Accordingly, the gate voltage of the nMOS transistor 60 falls, and thus the ON resistance of the nMOS transistor 60, becomes large. As a result, the reference voltage Vref rises to maintain voltage stability.

Figure 17:
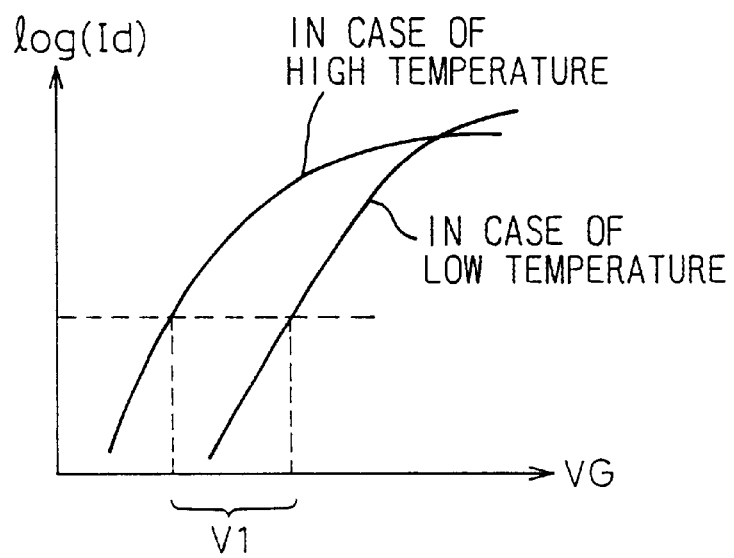
FIG. 17 is a graph showing VG-log(Id) characteristics of an enhancement type nMOS transistor.
Figure 18:
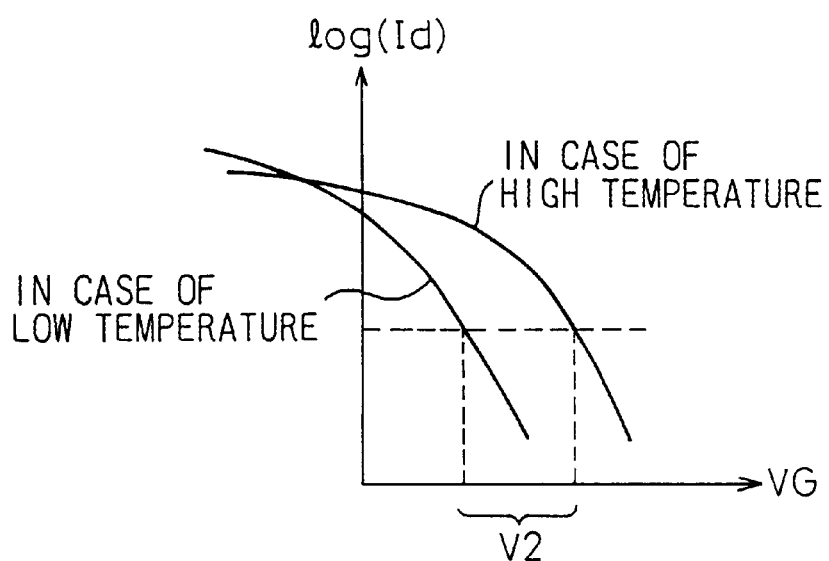
FIG. 18 is a graph showing VG-log(Id) characteristics of a depletion type pMOS transistor.

As described above, according to the ninth embodiment, the reference voltage Vref is subject to a feedback control through the source follower circuit 61. Accordingly, a stabilized reference voltage Vref having a constant voltage value can be obtained.

Where the gate-source voltage V1 of the nMOS transistor 60 is set to a value near the threshold voltage, it exhibits negative temperature characteristics as shown in FIG. 17, and the gate-source voltage V2 of the depletion type pMOS transistor 62 exhibits positive temperature characteristics is shown in FIG. 18. Accordingly, the temperature coefficient of the reference voltage Vref can be made zero (0).

Also, according to the ninth embodiment, the circuit formed by the pMOS transistors 59, 62, 63 and the nMOS transistor 60. Accordingly, it is possible to incorporate the present circuit into a MOS integrated circuit without increasing the production process.

For example, in the case of a DRAM, boron B as a type impurity is injected into a channel region of an nMOS transistor which constitutes a transfer gate of a corresponding memory cell. In this case, by simultaneously injecting boron B into a region of part of a pMOS transistor, it is possible to form the pMOS transistor as a depletion type pMOS transistor. Accordingly, in the production of a DRAM including depletion type pMOS transistors, it is possible to form the DRAM without increasing the production process.

Furthermore, according to the ninth embodiment, the circuit is formed by only the MOS transistors without using a resistor. As a result, it is possible to reduce the current flowing through the circuit, and thus to reduce the consumed current.

Figure 19:
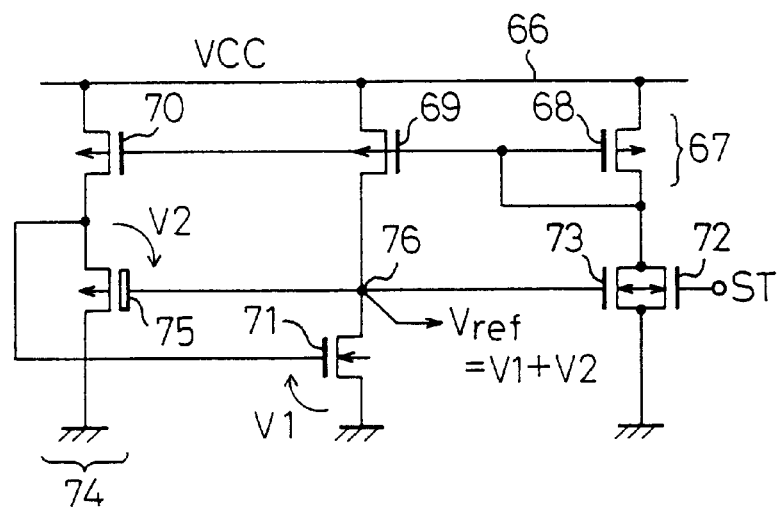
FIG. 19 is a circuit diagram showing a tenth embodiment of the present invention.

FIG. 19 illustrates the circuits formation of the tenth embodiment of the present invention. In the drawing, reference 66 denotes a power supply line for supplying a power supply voltage (non-stabilized voltage) VCC supplied from outside; reference 67 a current mirror circuit; and references 68, 69 and 70 each an enhancement type pMOS transistor.

Also, references 71, 72 and 73 denote enhancement type nMOS transistors. The nMOS transistor 71 is an nMOS transistor for obtaining a reference voltage Vref at a drain thereof; the nMOS transistor 72 is an nMOS transistor forming an activation circuit; and the nMOS transistor 73 is an nMOS transistor forming a constant current source. Also, reference 74 denotes a source follower circuit using the pMOS transistor 70 as a load element, and reference 75 denotes a depletion type pMOS transistor forming a driving element of the source follower circuit 74.

A source of the pMOS transistor 68 is connected to the VCC power supply line 66; a gate thereof is connected to a drain thereof; and the drain is connected to each drain of the nMOS transistors 72 and 73. Also, the nMOS transistor 72 is formed such that it receives an activation pulse ST at a gate thereof, and that a source thereof is grounded. Also, a gate of the nMOS transistor 73 is connected to node 76, and a source thereof is grounded. Also, a source of the pMOS transistor 69 is connected to the VCC power supply line 66; a gate thereof is connected to the gate of the pMOS transistor 68; and a drain is connected to the drain of the nMOS transistor 71. A source of the nMOS transistor 71 is grounded. Also, a source of the pMOS transistor 70 is connected to the VCC power supply line 66; a gate thereof is connected to the gate of the pMOS transistor 68; and a drain thereof is connected to the gate of the nMOS transistor 71. Also, a gate of the pMOS transistor 75 is connected to node 76; a source thereof is connected to the gate of the nMOS transistor 71; and a drain thereof is grounded.

In the tenth embodiment, when the nMOS transistor 72 is turned ON by the activation pulse ST, the pMOS transistors 68, 69 and 70 are turned ON, and thus currents flow through the respective transistors 68, 69 and 70. Namely, the entire circuit is activated.

Also, when the gate-source voltage of the nMOS transistor 71 is V1 and the gate-source voltage of the pMOS transistor 75 is V2, the reference voltage Vref of V1+V2 can be obtained at node 76.

When the reference voltage Vref rises due to any disturbance from outside, the source voltage of the pMOS transistor 75 rises. Accordingly, the gate voltage of the nMOS transistor 71 rises, and thus the ON resistance of the nMOS transistor 71 becomes small. As a result, the reference voltage Vref falls to maintain voltage stability.

Inversely, when the reference voltage Vref falls, the source voltage of the pMOS transistor 75 falls. Accordingly, the gate voltage of the nMOS transistor 71 falls, and thus the ON resistance of the nMOS transistor 71 becomes large. As a result, the reference voltage Vref rises to maintain voltage stability.

As described above, according to the tenth embodiment, the reference voltage Vref is subject to a feedback control through the source follower circuit 74. Accordingly, a stabilized reference voltage Vref having a constant voltage value can be obtained.

Although the nMOS transistor 72 is turned OFF after the activation of the circuit, it is possible to stably maintain the circuit operation since the nMOS transistor 73 is turned ON by the reference voltage Vref and functions as a constant current source.

The nMOS transistors 72 and 73 can be replaced by resistors. However, better constant current characteristics can be obtained by providing the nMOS transistors 72, 73 than by using resistors.

Where the gate-source voltage V1 of the nMOS transistor 71 is set to a value near the threshold voltage, it exhibits negative temperature characteristics, and the gate-source voltage V2 of the depletion type pMOS transistor 75 exhibits positive temperature characteristics. Accordingly, the temperature coefficient of the reference voltage Vref can be made zero (0).

Also, according to the tenth embodiment, the circuit is formed by the pMOS transistors 68 to 70 and 75 and the nMOS transistors 71 to 73. Accordingly, it is possible to incorporate the present circuit into a MOS integrated circuit without increasing the production process.

Furthermore, the circuit is formed by only the MOS transistors without using a resistor. As a result, it is possible to reduce the current flowing through the circuit, and thus to reduce the consumed current.

Figure 20:
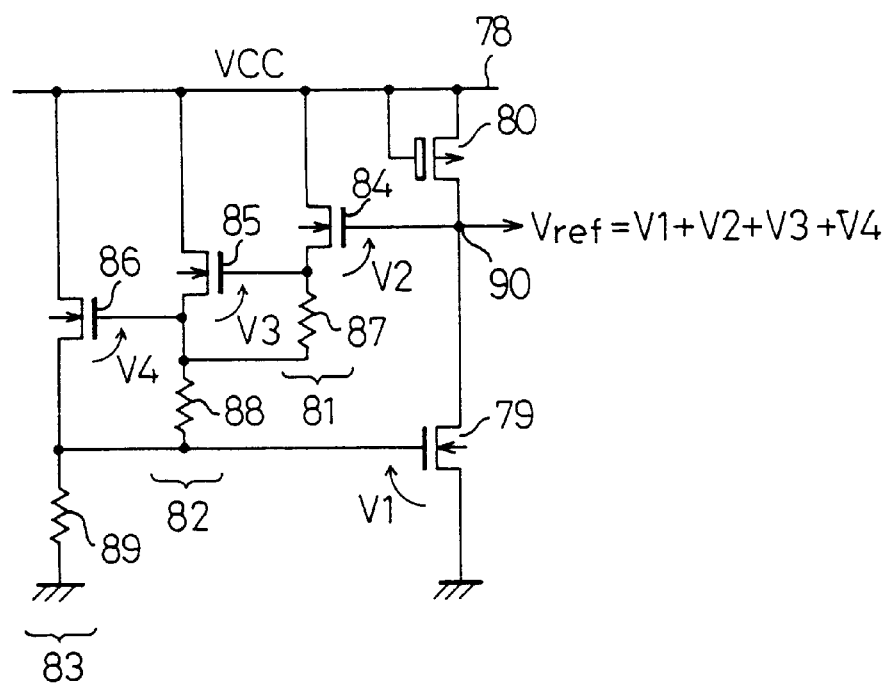
FIG. 20 is a circuit diagram showing an eleventh embodiment of the present invention.

FIG. 20 illustrates the circuit formation of the eleventh embodiment of the present invention. In the drawing, reference 78 denotes a power supply line for supplying a power supply voltage (non-stabilized voltage) VCC supplied from outside; reference 79 an enhancement type nMOS transistor; and reference 80 a depletion type pMOS transistor functioning as load means of the nMOS transistor 79.

Also, references 81, 82 and 83 each denote a source follower circuit; references 84, 85 and 86 each an enhancement type nMOS transistor functioning as a driving element; and references 87, 88 and 89 each a resistor functioning as a load element.

A source and a gate of the pMOS transistor 80 are connected to the VCC power supply line 78, and a drain thereof is connected to a drain of the nMOS transistor 79. A source of the nMOS transistor 79 is grounded. Also, a drain of the nMOS transistor 84 is connected to the VCC power supply line 78; a gate thereof is connected to node 90; and a source thereof is connected via the resistor 87 to a source of the nMOS transistor 85. Also, a drain of the nMOS transistor 85 is connected to the VCC power supply line 78; a gate thereof is connected to the source of the nMOS transistor 84; and the source thereof is connected via the resistor 88 to a source of the nMOS transistor 86. Also, a drain of the nMOS transistor 86 is connected to the VCC power supply line 78; a gate thereof is connected to the source of the nMOS transistor 85; and the source thereof is connected to a gate of the nMOS transistor 79 and is grounded via the resistor 89.

In the eleventh embodiment, when the gate-source voltage of the nMOS transistor 79 is V1; the gate-source voltage of the nMOS transistor 84 is V2; the gate-source voltage of the nMOS transistor 85 is V3; and the gate-source voltage of the nMOS transistor 86 is V4, the reference voltage Vref of V1+V2+V3+V4 can be obtained at node 90.

When the reference voltage Vref rises due to any disturbance from outside, the source voltages of the nMOS transistors 84, 85 and 86 sequentially rises. Accordingly, the gate voltage of the nMOS transistor 79 rises, and thus the ON resistance of the nMOS transistor 79 becomes small. As a result, the reference voltage Vref falls to maintain voltage stability.

Inversely, when the reference voltage Vref falls, the source voltages of the nMOS transistors 84, 85 and 86 sequentially falls. Accordingly, the gate voltage of the nMOS transistor 79 falls, and thus the ON resistance of the nMOS transistor 79 becomes large. As a result, the reference voltage Vref rises to maintain voltage stability.

As described above, according to the eleventh embodiment, the reference voltage Vref is subject to a feedback control through the source follower circuits 81, 82 and 83. Accordingly, a stabilized reference voltage Vref having a constant voltage value can be obtained.

Also, the circuit is constituted by the pMOS transistor 80 and the nMOS transistors 79 and 84 to 86. Accordingly, it is possible to incorporate the present circuit into a MOS integrated circuit without increasing the production process.

Furthermore, it is only necessary for the source follower circuit 83 to generate the gate-source voltage V1 of the nMOS transistor 79. Accordingly, it is possible to reduce the current without providing high resistances as the resistors 87, 88 and 89, and thus to reduce the consumed current.

Figure 21:
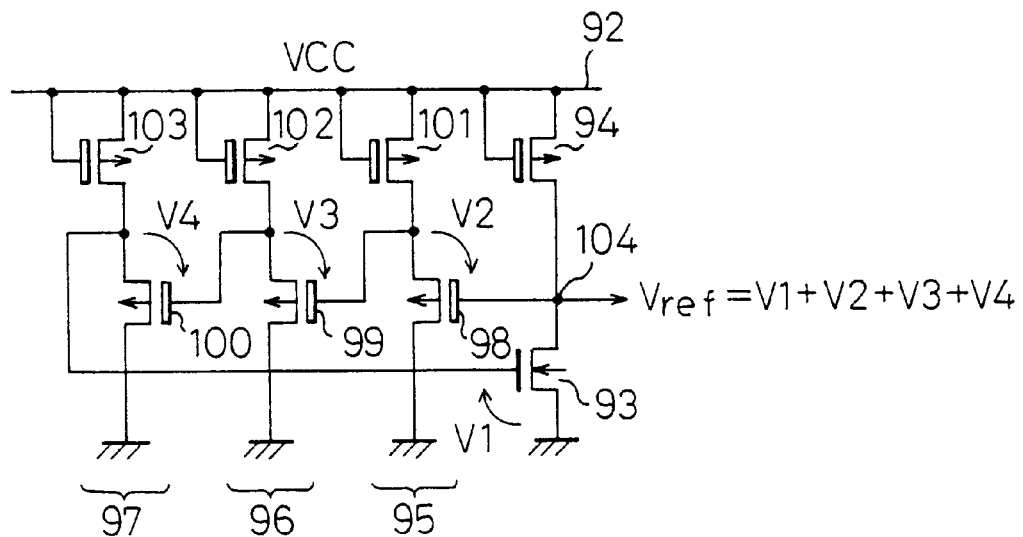
FIG. 21 is a circuit diagram showing a twelfth embodiment of the present invention.

FIG. 21 illustrates the circuit formation of the twelfth embodiment of the present invention. In the drawing, reference 92 denotes a power supply line for supplying a power supply voltage (non-stabilized voltage) VCC supplied from outside; reference 93 an enhancement type nMOS transistor; and reference 94 a depletion type pMOS transistor functioning as load means of the nMOS transistor 93.

Also, references 95, 96 and 97 each denote a source follower circuit; references 98, 99 and 100 each a depletion type pMOS transistor functioning as a driving element; and references 101, 102 and 103 each a depletion type pMOS transistor functioning as a load element.

A source and a gate of the pMOS transistor 94 are connected to the VCC power supply line 92, and a drain thereof is connected to a drain of the nMOS transistor 93. A source of the nMOS transistor 93 is grounded.

Also, a source and a gate of the pMOS transistor 101 are connected to the VCC power supply line 92, and a drain thereof is connected to a source of the pMOS transistor 98. A gate of the pMOS transistor 98 is connected to node 104, and a drain thereof is grounded.

Also, a source and a gate of the pMOS transistor 102 are connected to the VCC power supply line 92, and a drain thereof is connected to a source of the pMOS transistor 99. A gate of the pMOS transistor 99 is connected to the source of the pMOS transistor 98, and a drain thereof is grounded.

Also, a source and a gate of the pMOS transistor 103 are connected to the VCC power supply line 92, and a drain thereof is connected to a source of the pMOS transistor 100. A gate of the pMOS transistor 100 is connected to the source of the pMOS transistor 99; a drain thereof is grounded; and the source thereof is connected to a gate of the nMOS transistor 93.

In the twelfth embodiment, when the gate-source voltage of the nMOS transistor 93 is V1; the gate-source voltage of the pMOS transistor 98 is V2; the gate-source voltage of the pMOS transistor 99 is V3; and the gate-source voltage of the pMOS transistor 100 is V4, the reference voltage Vref of V1+V2+V3+V4 can be obtained at node 104.

When the reference voltage Vref rises due to any disturbance from outside, the source voltages of the pMOS transistors 98, 99 and 100 sequentially rises. Accordingly, the gate voltage of the nMOS transistor 93 rises, and thus the ON resistance of the nMOS transistor 93 becomes small. As a result, the reference voltage Vref falls to maintain voltage stability.

Inversely, when the reference voltage Vref falls, the source voltages of the nMOS transistors 98, 99 and 100 sequentially falls. Accordingly, the gate voltage of the nMOS transistor 93 falls, and thus the ON resistance of the nMOS transistor 93 becomes large. As a result, the reference voltage Vref rises to maintain voltage stability.

As described above, according to the twelfth embodiment, the reference voltage Vref is subject to a feedback control through the source follower circuits 95, 96 and 97. Accordingly, a stabilized reference voltage Vref having a constant voltage value can be obtained.

Also, when the gate-source voltage V1 of the nMOS transistor 93 is set to be a value near the threshold voltage and to have a negative temperature coefficient, it is possible to reduce the output internal resistance of the nMOS transistor 93 and thus to realize further stabilization of the reference voltage Vref. In this case, the temperature characteristics of the reference voltage Vref can be made positive since the gate-source voltages V2, V3 and V4 of the pMOS transistors 98, 99 and 100 have positive temperature coefficients, respectively.

Also, according to the twelfth embodiment, the circuit is formed by the pMOS transistors 94 and 98 to 103 and the nMOS transistor 93, and thus it is possible to incorporate the present circuit into a MOS integrated circuit without increasing the production process.

Furthermore, since the circuit is constituted by only the MOS transistors without using a resistor, it is possible to reduce the current flowing through the circuit, and thus to reduce the consumed current.

Figure 22:
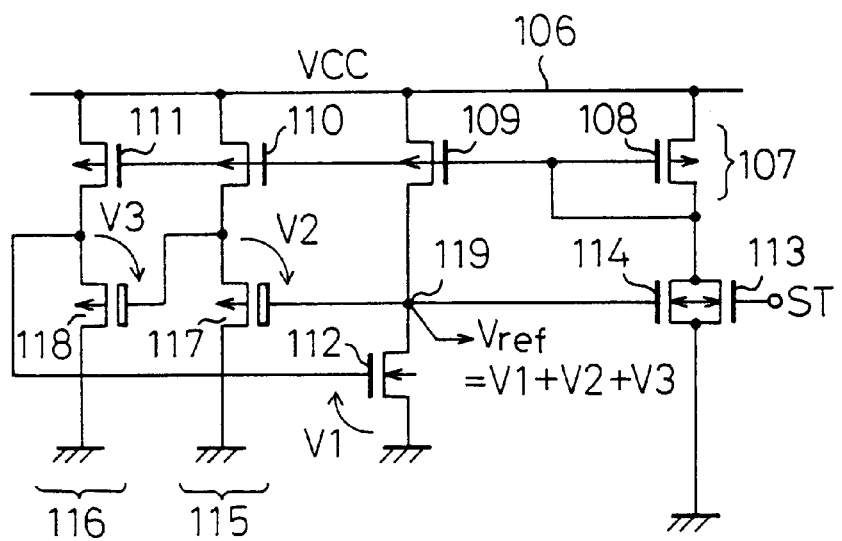
FIG. 22 is a circuit diagram showing a thirteenth embodiment of the present invention.

FIG. 22 illustrates the circuit formation of the thirteenth embodiment of the present invention. In the drawing, reference 106 denotes a power supply line for supplying a power supply voltage (non-stabilized voltage) VCC supplied from outside; reference 107 a current mirror circuit; and references 108, 109, 110 and 111 each an enhancement type pMOS transistor.

Also, references 112, 113 and 114 denote enhancement type nMOS transistors, respectively. The nMOS transistor 112 is an nMOS transistor for obtaining a reference voltage Vref at a drain thereof; the nMOS transistor 113 is an nMOS transistor for forming an activation circuit; and the nMOS transistor 114 is an nMOS transistor forming a constant current source.

Also, references 115 and 116 denote source follower circuits using enhancement type pMOS transistors 110 and 111 as load elements, respectively; and references 117 and 118 denote depletion type pMOS transistors functioning as driving elements, respectively.

A source of the pMOS transistor 108 is connected to the VCC power supply line 106; a gate thereof is connected to a drain thereof; and the drain is connected to each drain of the nMOS transistors 113, 114. Also, the nMOS transistor 113 is formed such that it receives an activation pulse ST at a gate thereof, and that a source thereof is grounded. Also, a gate of the nMOS transistor 114 is connected to node 119, and a source thereof is grounded.

Also, a source of the pMOS transistor 109 is connected to the VCC power supply line 106; a gate thereof is connected to the gate of the pMOS transistor 108; and a drain thereof is connected to a drain of the nMOS transistor 112. A source of the nMOS transistor 112 is grounded.

Also, a source of the pMOS transistor 110 is connected to the VCC power supply line 106; a gate thereof is connected to the gate of the pMOS transistor 108; and a drain thereof is connected to a source of the pMOS transistor 117. A gate of the pMOS transistor 117 is connected to node 119, and a drain thereof is grounded. Also, a source of the pMOS transistor 111 is connected to the VCC power supply line 106; a gate thereof is connected to the gate of the pMOS transistor 108; and a drain thereof is connected to a source of the pMOS transistor 118. A gate of the pMOS transistor 118 is connected to the source of the pMOS transistor 117; the source thereof is connected to a gate of the nMOS transistor 112; and a drain thereof is grounded.

In the thirteenth embodiment, when the nMOS transistor 113 is turned ON by the activation pulse ST, the pMOS transistors 108 to 111 are all turned ON, and thus currents flow through the pMOS transistors 108 to 111, respectively. Namely, the entire circuit is activated.

Also, when the gate-source voltage of the nMOS transistor 112 is V1; the gate-source voltage of the pMOS transistor 117 is V2; and the gate-source voltage of the pMOS transistor 118 is V3, the reference voltage Vref of V1+V2+V3 can be obtained at node 119.

When the reference voltage Vref rises due to any disturbance from outside, the source voltage of the pMOS transistor 117 rises, and thus the source voltage of the pMOS transistor 118 rises. Accordingly, the gate voltage of the nMOS transistor 112 rises, and thus the ON resistance of the nMOS transistor 112 becomes small. As a result, the reference voltage Vref falls to maintain voltage stability.

Inversely, when the reference voltage Vref falls, the source voltage of the pMOS transistor 117 falls, and thus the source voltage of the pMOS transistor 118 falls. Accordingly, the gate voltage of the nMOS transistor 112 falls, and thus the ON resistance of the nMOS transistor 112 becomes large. As a result, the reference voltage Vref rises to maintain voltage stability.

As described above, according to the thirteenth embodiment, the reference voltage Vref is subject to a feedback control through the source follower circuits 115 and 116. Accordingly, a stabilized reference voltage Vref having a constant voltage value can be obtained.

Although the nMOS transistor 113 is turned OFF after the activation of the circuit, it is possible to stably maintain the circuit operation since the nMOS transistor 114 is turned ON by the reference voltage Vref and functions as a constant current source.

Also, the nMOS transistors 113 and 114 can be replaced by resistors. However, better constant current source characteristics can be obtained by providing the nMOS transistors 113 and 114 than the use of resistors.

Where the gate-source voltage V1 of the nMOS transistor 112 is set to a value near the threshold voltage, it exhibits negative temperature characteristics, and the gate-source voltages V2, V3 of the depletion type pMOS transistors 117, 118 exhibit positive temperature characteristics. Accordingly, the temperature coefficient of the reference voltage Vref can be made positive.

Also, according to the thirteenth embodiment, the circuit is formed by the pMOS transistors 108 to 111, 117 and 118 and the nMOS transistors 112 to 114. Accordingly, it is possible to incorporate the present circuit into a MOS integrated circuit without increasing the production process.

Furthermore, the circuit is formed by only the MOS transistors without using a resistor. Accordingly, it is possible to reduce the, current flowing through the circuit, and thus to reduce the consumed current.

Figure 23:
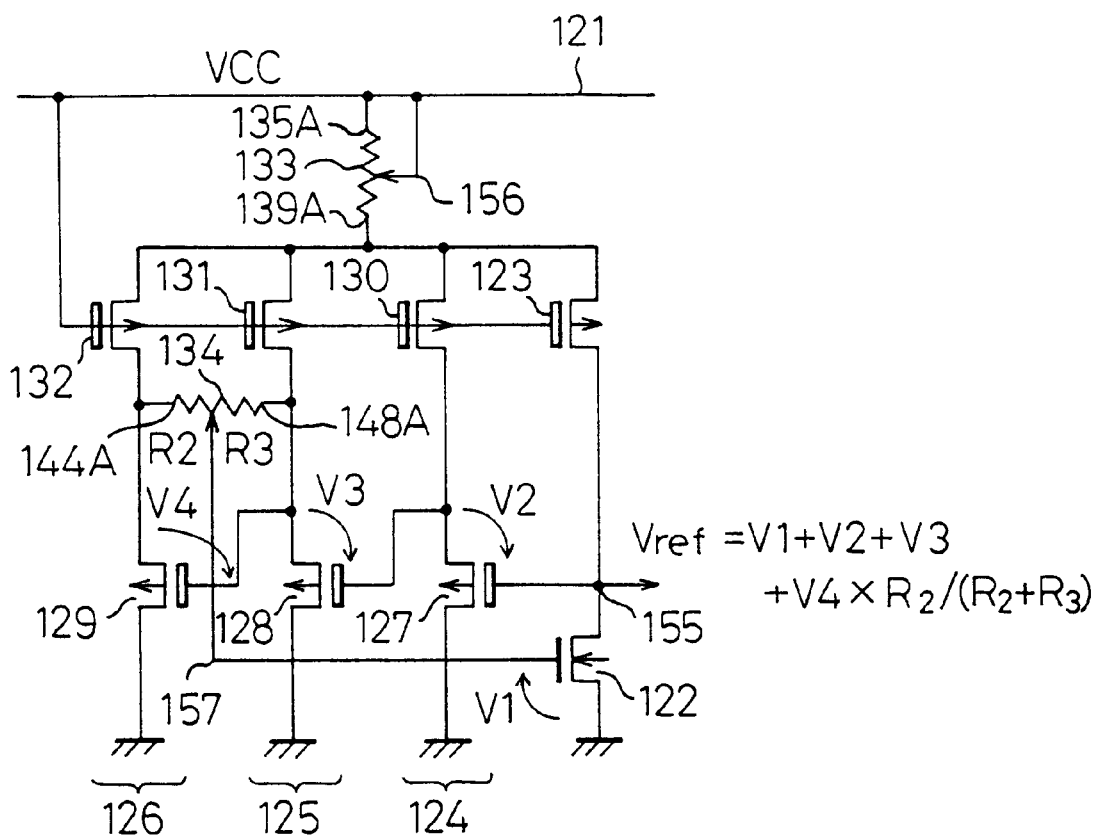
FIG. 23 is a circuit diagram showing a fourteenth embodiment of the present invention.

FIG. 23 illustrates the circuit formed of the fourteenth embodiment of the present invention. In the drawing, reference 121 denotes a power supply line for supplying a power supply voltage (non-stabilized voltage) VCC from outside; reference 122 an enhancement type nMOS transistor; and reference 123 a depletion type pMOS transistor functioning as load means of the nMOS transistor 122.

Also, references 124 to 126 each denote a source follower circuit; references 127 to 129 each a depletion type pMOS transistor functioning as a driving element; and references 130 to 132 each a depletion type pMOS transistor functioning as a load element.

Also, reference 133 denotes a current fine-adjustment circuit for finely adjusting respective currents of the pMOS transistors 123 and 130 to 132 which constitute a load current source, and reference 134 denotes a reference voltage fine-adjustment circuit for finely adjusting the reference voltage Vref.

Figure 24:
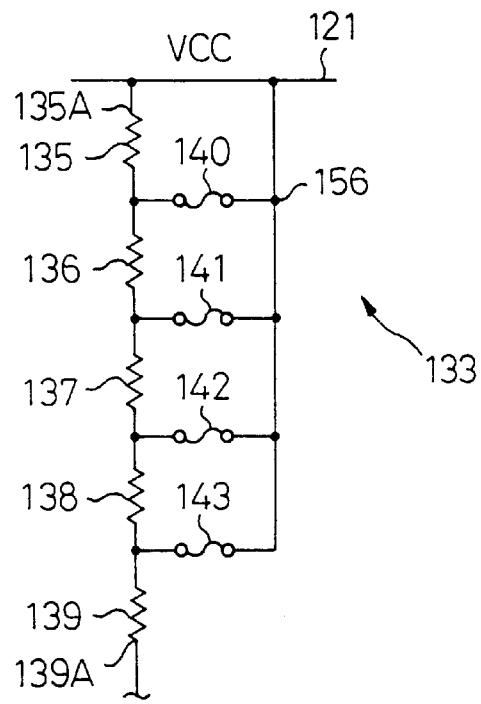
FIG. 24 is a circuit diagram showing a current fine-adjustment circuit provided in the circuit of FIG. 23.

The current fine-adjustment circuit 133 has the circuit formation as shown in FIG. 24. In the drawing, references 135 to 139 denote resistors, respectively; and references 140 to 143 denote fuses, respectively, which can be cut off by a laser beam. The current fine-adjustment circuit 133 is used in a state where any one of the fuses 140 to 143 is kept uncut and the others are all kept cut-off.

Figure 25:
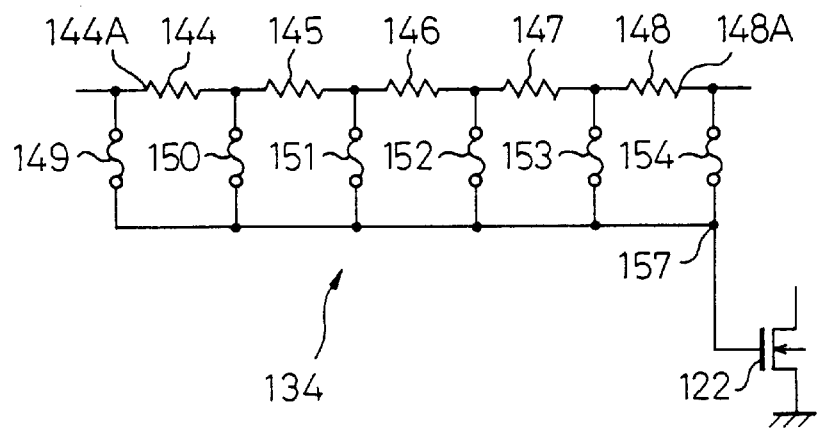
FIG. 25 is a circuit diagram showing a reference voltage fine-adjustment circuit provided in the circuit of FIG. 23.

Also, the reference voltage fine-adjustment circuit 134 has the circuit formation as shown in FIG. 25. In the drawing, references 144 to 148 denote resistors, respectively; and references 149 to 154 denote fuses, respectively, which can be cut off by a laser beam. The reference voltage fine-adjustment circuit 134 is used in a state where any one of the fuses 149 to 154 is kept uncut and the others are all kept cut-off.

In the current fine-adjustment circuit 133, an end portion 135A of the resistor 135 and a common end 156 of the fuses 140 to 143 are connected to the VCC power supply line 121, and an end portion 139A of the resistor 139 is connected to sources of the pMOS transistors 123 and 130 to 132.

Also, a gate of the pMOS transistor 123 is connected to the VCC power supply line 121, and a drain thereof is connected to a drain of the nMOS transistor 122. A source of the nMOS transistor 122 is grounded.

Also, a gate of the pMOS transistor 130 is connected to the VCC power supply line 121, and a drain thereof is connected to a source of the pMOS transistor 127. A gate of the pMOS transistor 127 is connected to node 155, and a drain thereof is grounded.

Also, a gate of the pMOS transistor 131 is connected to the VCC power supply line 121, and a drain thereof is connected to a source of the pMOS transistor 128. A gate of the pMOS transistor 128 is connected to the source of the pMOS transistor 127, and a drain thereof is grounded.

Also, a gate of the pMOS transistor 132 is connected to the VCC power supply line 121, and a drain thereof is connected to a source of the pMOS transistor 129. A gate of the pMOS transistor 129 is connected to the source of the pMOS transistor 128, and a drain thereof is grounded.

In the reference voltage fine-adjustment circuit 134, an end portion 144A of the resistor 144 is connected to the source of the pMOS transistor 129; an end portion 148A of the resistor 148 is connected to the source of the pMOS transistor 128; and a common end 157 of the fuses 149 to 154 is connected to the gate of the nMOS transistor 122.

According to the fourteenth embodiment, where respective threshold voltages of the pMOS transistors 123 and 130 to 132 are different from each other due to an estimation error or variance of production, it is possible to carry out fine-adjustment with respect to the threshold voltages by means of the current fine-adjustment circuit 133.

In the fourteenth embodiment, any one of the fuses 149 to 154 in the reference voltage fine-adjustment circuit 134 is kept uncut, while the others are kept cut-off. In this case, when a value of the resistance connected to the source of the pMOS transistor 129 is $R_2$; a value of the resistance connected to the source of the pMOS transistor 128 is $R_3$; the gate-source voltage of the nMOS transistor 122 is V1; the gate-source voltage of the pMOS transistor 127 is V2; the gate-source voltage of the pMOS transistor 128 is V3; and the gate-source voltage of the pMOS transistor 129 is V4, the reference voltage Vref of $V1+V2+V3+V4\times R_2/(R_2+R_3)$ can be obtained at node 155.

Now, it is assumed that the threshold voltages of the nMOS transistor 122 and the pMOS transistors 127 to 129 are set so as to satisfy the relations of V1=0.5 [V], and V2=V3=V4=0.9 [V]. Also, it is assumed that each resistance value of the resistors 144 to 148 is 100 [K Ω].

In this case, when the fuse 149 is uncut and the fuses 150 to 154 are cut, the reference voltage is given by Vref=0.5+0.9+0.9+0.9×(0/500)=2.3 [V].

Also, when the fuse 150 is uncut and the fuses 149 and 151 to 154 are cut, the reference voltage is given by Vref=0.5+0.9+0.9+0.9×(100/500)=2.48 [V].

Also, when the fuse 151 is uncut and the fuses 149, 150 and 152 to 154 are cut, the reference voltage is given by Vref=0.5+0.9+0.9+0.9×(200/500)=2.66 [V].

Also, when the fuse 152 is uncut and the fuses 149 to 151, 153 and 154 are cut, the reference voltage is given by Vref=0.5+0.9+0.9+0.9×(300/500)=2.84 [v].

Also, when the fuse 153 is uncut and the fuses 149 to 152 and 154 are cut, the reference voltage is given by Vref=0.5+0.9+0.9+0.9×(400/500)=3.02 [V].

Also, when the fuse 154 is uncut and the fuses 149 to 153 are cut, the reference voltage is given by Vref=0.5+0.9+0.9+0.9×(500/500)=3.20 [V].

In the fourteenth embodiment, when the reference voltage Vref rises due to any disturbance from outside, the source voltages of the pMOS transistors 127, 128 and 129 sequentially rise, and thus the voltage at node 157 rises. Accordingly, the gate voltage of the nMOS transistor 122 rises, and thus the ON resistance of the nMOS transistor 122 becomes small. As a result, the reference voltage Vref falls to maintain voltage stability.

Inversely, when the reference voltage Vref falls, the source voltages of the pMOS transistors 127, 128 and 129 sequentially fall, and thus the voltage at node 157 falls. Accordingly, the gate voltage of the nMOS transistor 122 falls, and thus the ON resistance of the nMOS transistor 122 becomes large. As a result, the reference voltage Vref rises to maintain voltage stability.

As described above, according to the fourteenth embodiment, the reference voltage Vref is subject to a feedback control through the source follower circuits 124 to 126. Accordingly, a stabilized reference voltage Vref having a constant voltage value can be obtained.

Also, when the gate-source voltage V1 of the nMOS transistor 122 is set to be a value near the threshold voltage and to have a negative temperature coefficient, it is possible to reduce the output internal resistance of the nMOS transistor 122 and thus to realize further stabilization of the reference voltage Vref. In this case, the temperature characteristics of the reference voltage Vref can be made positive since the gate-source voltages V2, V3 and V4 of the pMOS transistors 127, 128 and 129 have positive temperature coefficients, respectively.

Also, in the fourteenth embodiment, the circuit is formed by the pMOS transistors 123, 127 to 129, 130 to 132, the nMOS transistor 122, the resistors 135 to 139, 144 to 148 and the fuses 140 to 143, 149 to 154. Accordingly, it is possible to incorporate the present circuit into an MOS integrated circuit without increasing the production process.

Furthermore, although the resistors 135 to 139 and 144 to 148 are provided, the current flowing through the circuit can be defined by the pMOS transistors 123 and 130 to 132. As a result, it is possible to reduce the current, and thus to reduce the consumed current.

Figure 26:
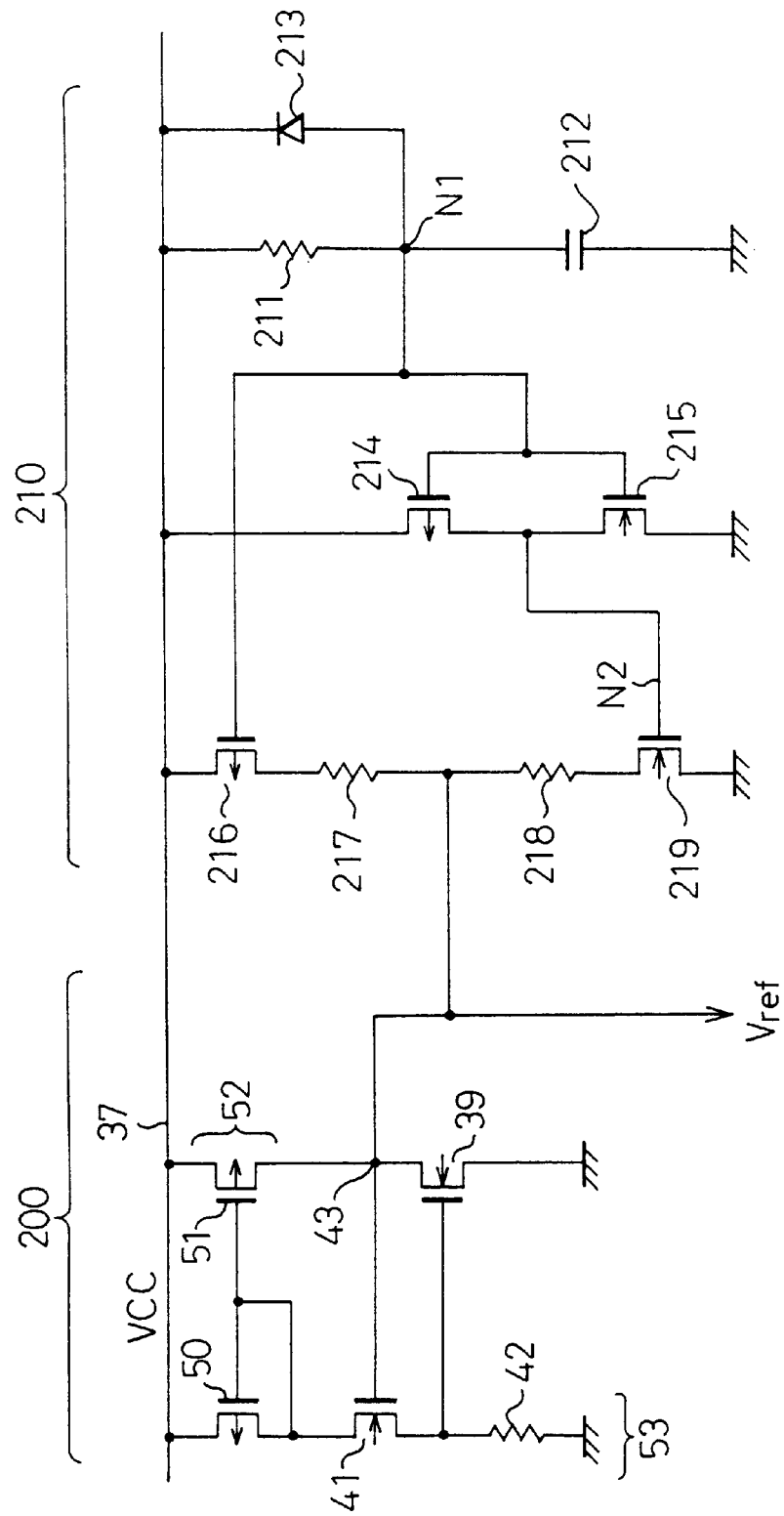
FIG. 26 is a circuit diagram showing a fifteenth embodiment of the present invention.

FIG. 26 illustrates the circuit formation of the fifteenth embodiment of the present invention.

The illustrated circuit is an improvement of the fifth embodiment (see FIG. 12), and is characterized in that a start-up circuit 210 is further provided in addition to the circuit formation of FIG. 12.

The start-up circuit 210 includes a resistor 211 having one end thereof connected to the VCC power supply line 37; a capacitor 212 connected between the other end (node N1) of the resistor 211 and the ground; a diode 213 connected between node N1 and the VCC power supply line 37; a CMOS inverter (pMOS transistor 214 and nMOS transistor 215) connected between the VCC power supply line 37 and the ground and responsive to a voltage at node N1; a pMOS transistor 216 having a source thereof connected to the VCC power supply line 37 and responsive to a voltage at node N1; an nMOS transistor 219 having a source thereof connected to the ground and responsive to a voltage at the output end (node N2) of the CMOS inverter 214, 215; and resistors 217 and 218 connected in series between a drain of the pMOS transistor 216 and a drain of the nMOS transistor 219. A connection point of the resistors 217, 218 is connected to node 43, i.e., to the drain of the nMOS transistor 39 in the reference voltage generation circuit portion 200.

According to the circuit formation of FIG. 12, there is a possibility in that the reference voltage Vref is not satisfactorily generated when the power supply voltage VCC is slowly increased. Namely, in the course of the slow increase of the power supply voltage VCC, when the reference voltage Vref is too low to turn ON the transistor 41, both the transistor 39 and the transistor 51 are brought to an OFF state. As a result, a potential at node 43 (i.e., reference voltage Vref) becomes unstable.

To cope with this, the present embodiment employs the above start-up circuit 210.

In the formation of FIG. 26, when the power 30 supply voltage VCC is powered ON, a potential at node N1 is first at "L" level (ground level). With a lapse of time, the capacitor 212 is charged via the resistor 211 from the VCC power supply line 37. Finally, the potential at node N1 is raised up to "H" level (VCC 35 level). Time in which the potential at node N1 is changed from the ground level to the VCC level is determined by a time constant defined by the resistor 211 and the capacitor 212.

When the potential at node N1 is at the ground level, both the transistor 216 and the transistor 214 are turned ON, and thus a potential at node N2 is raised to the VCC level. As a result, the transistor 219 is turned ON, and thus a voltage divided by the resistors 217 and 218 (i.e., divided voltage) appears at node 43, regardless of the operation of the reference voltage generation circuit portion 200.

In response to the divided voltage fed to node 43, the reference voltage generation circuit portion 200 can start its normal operation. With a lapse of time, the potential at node N1 is raised to the VCC level by means of the operation of the timer circuit 211, 212, and thus both the transistor 216 and the transistor 219 are turned OFF. At this time, the reference voltage Vref having an appropriate temperature characteristic is generated. Note, the diode 213 is provided for discharging charges in the capacitor 212 to reset the start-up circuit 210 when the power supply voltage VCC is powered OFF.

Thus, according to the circuit construction of the fifteenth embodiment, the start-up circuit 210 supplies the reference voltage generation circuit portion 200 with the predetermined level voltage (i.e., the voltage divided by the resistors 217, 218) during a predetermined period after the power-ON, and stops the supply of the predetermined level voltage after a lapse of the predetermined period.

Additionally, the resistors 217, 218 can be formed by impurity diffusion regions formed in the semiconductor (Si) substrate, or can be formed using electrode materials such as polysilicon. Also, without using the resistors 217, 218, transistors having a large internal resistance may be used as the transistors 216, 219.

Figure 27:
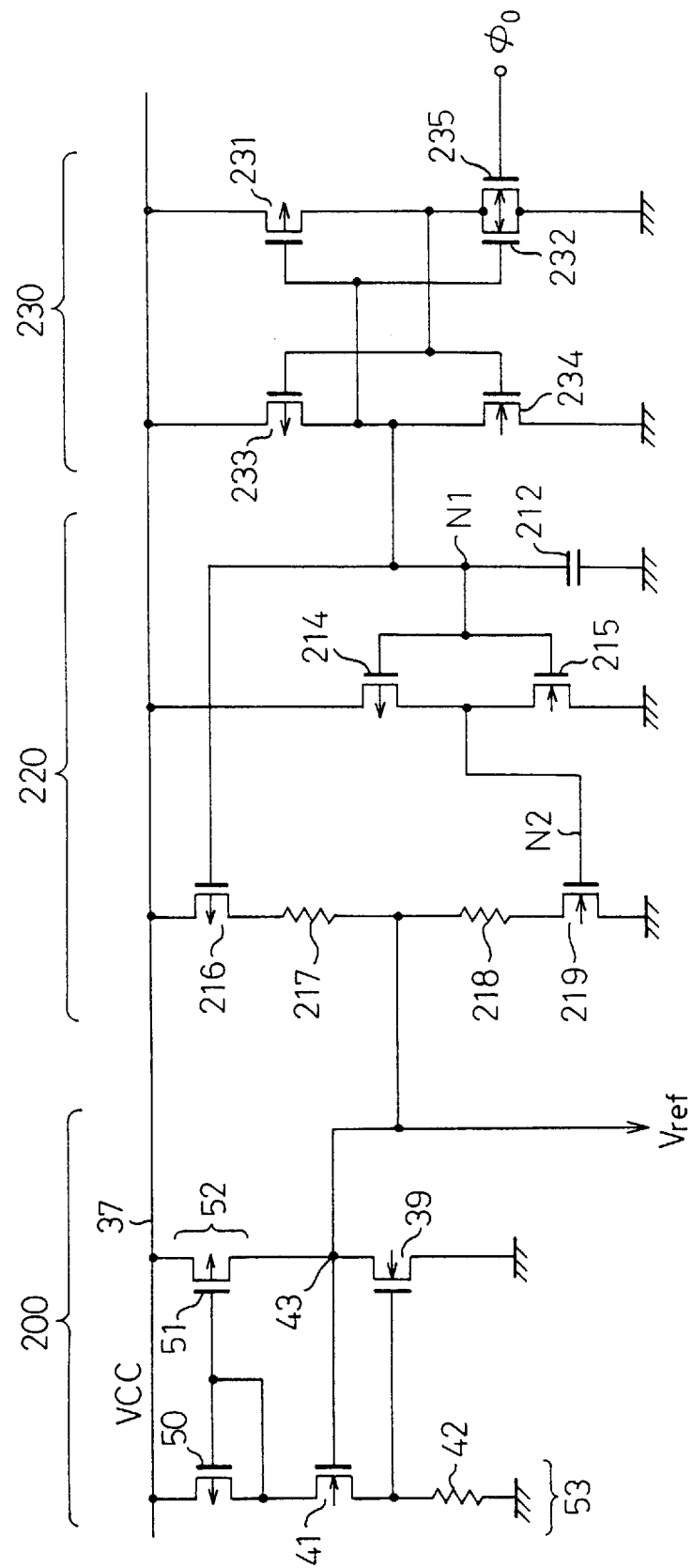
FIG. 27 is a circuit diagram showing a sixteenth embodiment of the present invention.

FIG. 27 illustrates the circuit formation of the sixteenth embodiment of the present invention.

The illustrated circuit is another improvement of the fifth embodiment (see FIG. 12), and is characterized in that a latch circuit 230 for clamping the potential at node N1 to "L" level (ground level) at a power-ON is added to the circuit formation of FIG. 26. Note, reference 220 denotes a start-up circuit.

The latch circuit 230 includes a flip-flop, and an nMOS transistor 235 for inverting an output state of the flip-flop in response to a control clock $\phi_0$. The flip-flop includes a pMOS transistor 231 having a source thereof connected to the VCC power supply line 37 and a gate thereof connected to node N1; an nMOS transistor 232 connected between a drain of the pMOS transistor 231 and the ground and having a gate thereof connected to node N1; a pMOS transistor 233 having a source thereof connected to the VCC power supply line 37 and a gate is thereof connected to the drain of the pMOS transistor 231; and an nMOS transistor 234 connected between a drain of the pMOS transistor 233 and the ground and having a gate thereof connected to the drain of the pMOS transistor 231. Also, the nMOS transistor 235 is connected in parallel with the nMOS transistor 232.

According to the circuit formation of FIG. 26, when the power supply voltage VCC is powered ON, the potential at node N1 gradually rises from the ground level to the VCC level, depending on the time constant defined by the resistor 211 and the capacitor 212.

Contrary to this, according to the circuit formation of FIG. 27, when the power supply voltage VCC is powered ON, the potential at node N1 is clamped to the ground level by the latch circuit 230. When the control clock $\phi_0$ of "H" level is fed to the gate of the nMOS transistor 235 at an arbitrary timing after the power-ON, the nMOS transistor 235 is turned ON, and thus the pMOS transistor 233 is turned ON. As a result, the output state of the flip-flop (i.e., the potential at node N1) is inverted from "L" level to "H" level (VCC level).

The control clock $\phi_0$ can be made, for example, from an active-low row address strobe (RASX) signal used in a DRAM device.

Figure 28:
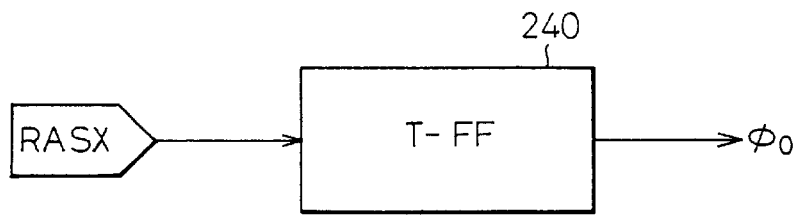
FIG. 28 is a block diagram showing a circuit for generating the control clock used in the circuit of FIG. 27.
Figure 29:
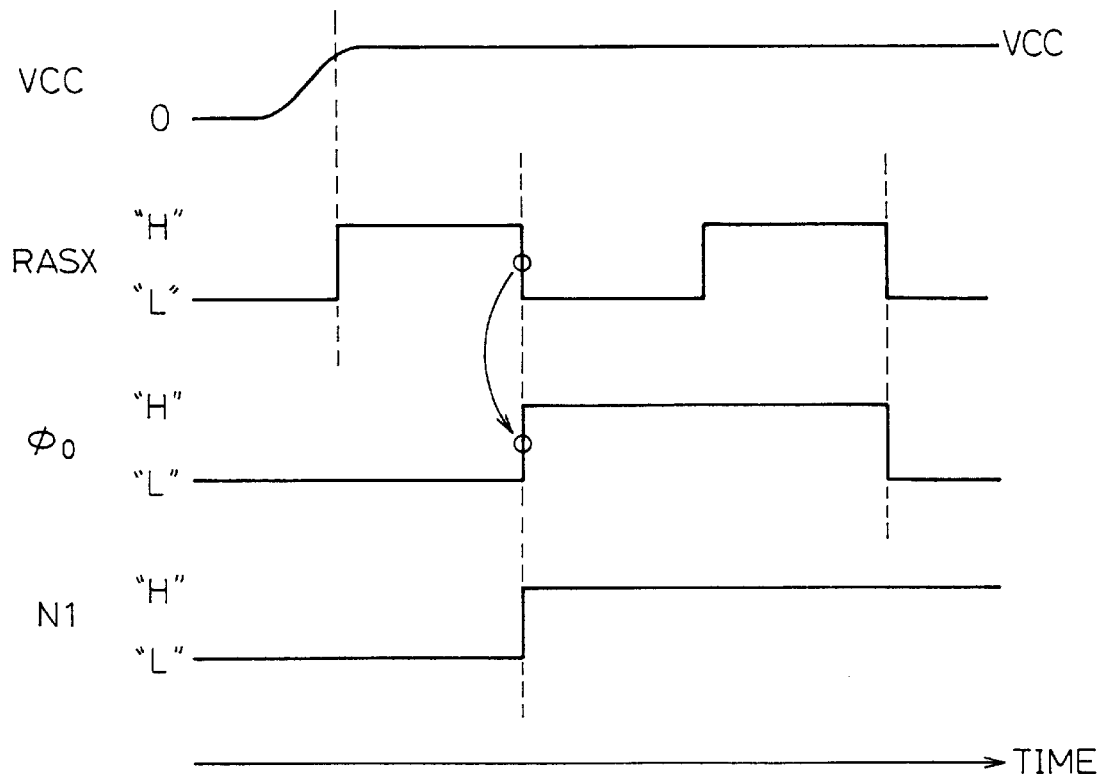
FIG. 29 is a timing chart showing an operation of the circuit of FIG. 27.

FIG. 28 illustrates an example for generating the control clock $\phi_0$, and FIG. 29 shows the operational timing chart thereof.

As shown in FIGS. 28 and 29, by using an negative edge trigger type flip-flop (T-FF) 240 responsive to the RASX signal, when the power supply voltage VCC is powered ON, it is possible to keep the control clock $\phi_0$ at "L" level, regardless of the logic level of the RASX signal. Namely, since the potential at node N1 is clamped to "L" level (ground, level) at the power-ON, it is possible to assuredly start the operation of the reference voltage generation circuit portion 200.

Although the present invention has been disclosed and described by way of sixteen embodiments, it is apparent to those skilled in the art that other embodiments and modifications of the present invention are possible without departing from the essential features thereof.

What is claimed is:

1. A reference voltage generation circuit comprising:
    a current mirror circuit including a first enhancement type p-channel MIS transistor having a source thereof connected to a higher voltage power supply line, and a gate thereof connected to a drain thereof, and a second enhancement type p-channel MIS transistor having a source thereof connected to said higher voltage power supply line, and a gate thereof connected to the gate of said first enhancement type p-channel MIS transistor;
    an enhancement type n-channel MIS transistor having a drain thereof connected to a drain of said second enhancement type p-channel MIS transistor, and a source thereof connected to a lower voltage power supply line; and
    a source follower circuit having an input end thereof connected to the drain of said n-channel MIS transistor, and an output end thereof connected to a gate of said n-channel MIS transistor;
    wherein a reference voltage is obtained at the drain of said n-channel MIS transistor.

2. The reference voltage generation circuit according to claim 1, wherein said source follower circuit comprises:
    a second enhancement type n-channel MIS transistor having a drain thereof connected to the drain of said first enhancement type p-channel MIS transistor, a gate thereof connected to the drain of said enhancement type n-channel MIS transistor, and a source thereof connected to the gate of said enhancement type n-channel MIS transistor; and
    a resistance element having one end thereof connected to the source of said second enhancement type n-channel MIS transistor, and the other end thereof connected to said lower voltage power supply line.

3. The reference voltage generation circuit according to claim 2, further comprising a level shift means connected between the source of said second enhancement type n-channel MIS transistor and the gate of said enhancement type n-channel MIS transistor.

4. The reference voltage generation circuit according to claim 3, wherein said level shift means comprises a second resistance element.

5. The reference voltage generation circuit according to claim 3, wherein said level shift means comprises a third enhancement type n-channel MIS transistor having a gate thereof connected to a drain thereof, the drain being connected to the source of said second enhancement type n-channel MIS transistor, and having a source thereof connected to the gate of said enhancement type n-channel MIS transistor.

6. The reference voltage generation circuit according to claim 3, wherein said level shift means comprises a diode having an anode thereof connected to the source of said second enhancement type n-channel MIS transistor, and a cathode thereof connected to the gate of said enhancement type n-channel MIS transistor.

7. The reference voltage generation circuit according to claim 2, wherein said enhancement type n-channel MIS transistor is biased in a region where temperature characteristics of a gate-source voltage at a constant drain current become negative, and said second enhancement type n-channel MIS transistor is biased in a region where temperature characteristics of a gate-source voltage at a constant drain current become positive.

8. The reference voltage generation circuit according to claim 2, wherein said enhancement type n-channel MIS transistor is biased in a region where temperature characteristics of a gate-source voltage at a constant drain current become positive, and said second enhancement type n-channel MIS transistor is biased in a region where temperature characteristics of a gate-source voltage at a constant drain current become negative.

9. The reference voltage generation circuit according to claim 2, wherein said enhancement type n-channel MIS transistor and said second enhancement type n-channel MIS transistor are biased in a region where temperature characteristics of respective gate-source voltages at a constant drain current become positive.

10. The reference voltage generation circuit according to claim 2, further comprising a control means for supplying a predetermined level voltage to the drains of said enhancement type n-channel MIS transistor and said second enhancement type p-channel MIS transistor during a predetermined period after a power-ON of said higher voltage power supply line, and for stopping the supply of the predetermined level voltage after a lapse of the predetermined period.

11. The reference voltage generation circuit according to claim 10, wherein said control means comprises a timer circuit utilizing a CR time constant for defining said predetermined period.

12. The reference voltage generation circuit according to claim 10, wherein said control means comprises a circuit responsive to a control clock, for switching a timing of the supply of said predetermined level voltage and a timing of the stopping of the supply thereof.

13. The reference voltage generation circuit according to claim 1, wherein said MIS transistor is an insulated-gate field-effect transistor.

* * * * *